(12) United States Patent
Matsuura

(10) Patent No.: US 7,815,739 B2
(45) Date of Patent: Oct. 19, 2010

(54) VERTICAL BATCH PROCESSING APPARATUS

(75) Inventor: Hiroyuki Matsuura, Esashi (JP)

(73) Assignee: Tokyo Electron Limited, Tokyo (JP)

( * ) Notice: Subject to any disclaimer, the term of this patent is extended or adjusted under 35 U.S.C. 154(b) by 1211 days.

(21) Appl. No.: 11/354,966

(22) Filed: Feb. 16, 2006

(65) Prior Publication Data

US 2006/0185592 A1 Aug. 24, 2006

(30) Foreign Application Priority Data

Feb. 18, 2005 (JP) .............................. 2005-043245

(51) Int. Cl.
*C23C 16/00* (2006.01)
*C23F 1/00* (2006.01)
*H01L 21/306* (2006.01)

(52) U.S. Cl. .................. 118/719; 118/724; 118/725; 156/345.31; 156/345.32; 156/345.33; 156/345.37; 414/217; 414/939; 414/940

(58) Field of Classification Search ................ 118/719; 156/345.31, 345.32; 414/935–941
See application file for complete search history.

(56) References Cited

U.S. PATENT DOCUMENTS

| | | | | |
|---|---|---|---|---|
| 6,369,361 | B2 * | 4/2002 | Saito et al. | ................... 219/390 |
| 6,444,083 | B1 * | 9/2002 | Steger et al. | ........... 156/345.48 |
| 2002/0036066 | A1 * | 3/2002 | Ogawa et al. | ................ 156/345 |
| 2002/0124867 | A1 * | 9/2002 | Kim et al. | ..................... 134/1.2 |
| 2003/0053893 | A1 * | 3/2003 | Matsunaga et al. | .......... 414/217 |
| 2007/0062646 | A1 | 3/2007 | Ogawa et al. | |

FOREIGN PATENT DOCUMENTS

| | | |
|---|---|---|
| JP | 2001-284307 | 10/2001 |
| JP | 2002-100574 | 4/2002 |
| JP | 2002-170813 | 6/2002 |
| JP | 2002-289596 | 10/2002 |
| JP | 2003-59899 | 2/2003 |
| JP | 2003059899 A * | 2/2003 |
| JP | 2003-133284 | 5/2003 |
| JP | 2003133284 A * | 5/2003 |
| JP | 2003-188149 | 7/2003 |
| JP | 2003-324045 | 11/2003 |
| JP | 2004-128380 | 4/2004 |
| JP | 2004-128382 | 4/2004 |
| JP | 2004128380 A * | 4/2004 |
| JP | 2004-304096 | 10/2004 |
| JP | 2004-343017 | 12/2004 |
| JP | 2005-39185 | 2/2005 |
| KR | 2002-0024554 | 3/2002 |

* cited by examiner

*Primary Examiner*—Karla Moore
(74) *Attorney, Agent, or Firm*—Oblon, Spivak, McClelland, Maier & Neustadt, L.L.P.

(57) ABSTRACT

A semiconductor processing system includes a casing forming a handling area. The handling area includes a main-process area and a pre-process area divided from each other and connected through an openable port. The main-process area and the pre-process area are connected to their own lines for vacuum-exhausting gas therefrom and their own lines for supplying an inactive gas thereinto and adjust pressure independently. A transfer port unit is disposed on the casing to place a transfer container that stores target objects. The transfer port unit allows the transfer container to open to the main-process area while maintaining an airtightness of the main-process area. The system includes a vertical batch main-processing apparatus. The system also includes a vertical batch pre-processing apparatus connected to the pre-process area and that performs a pre-process on the target objects and transforms a semiconductor oxide film on the target objects into an intermediate film.

27 Claims, 18 Drawing Sheets

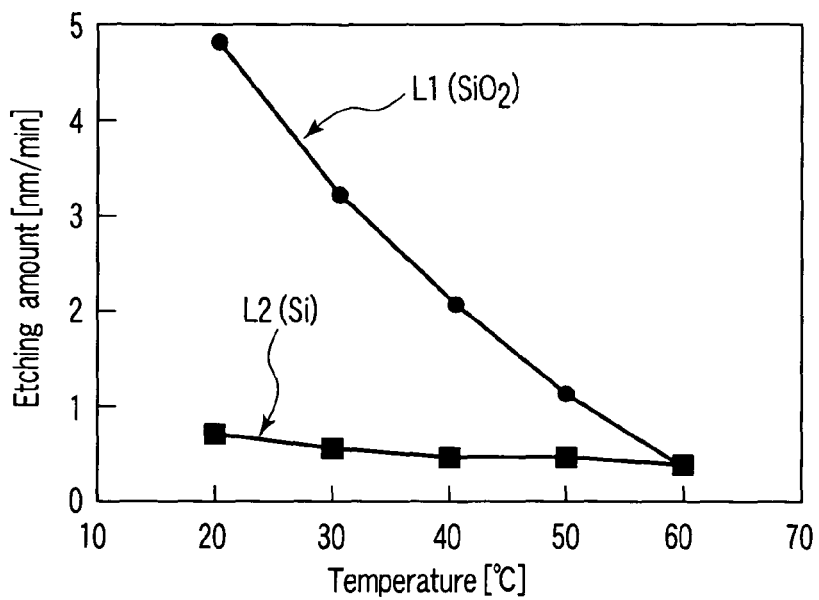
F I G. 9
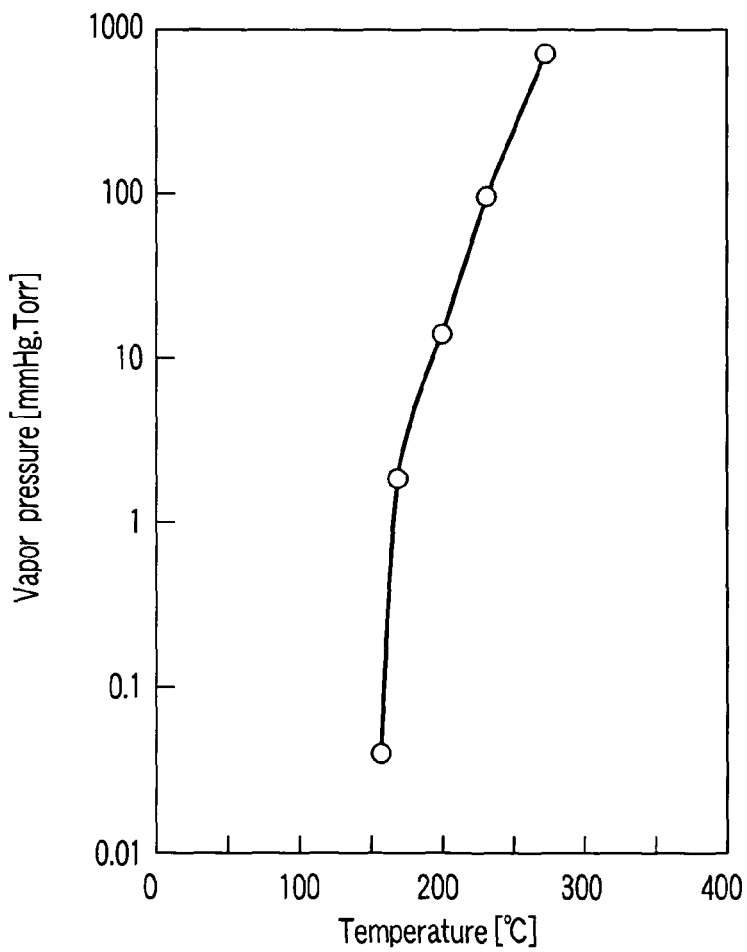
F I G. 10

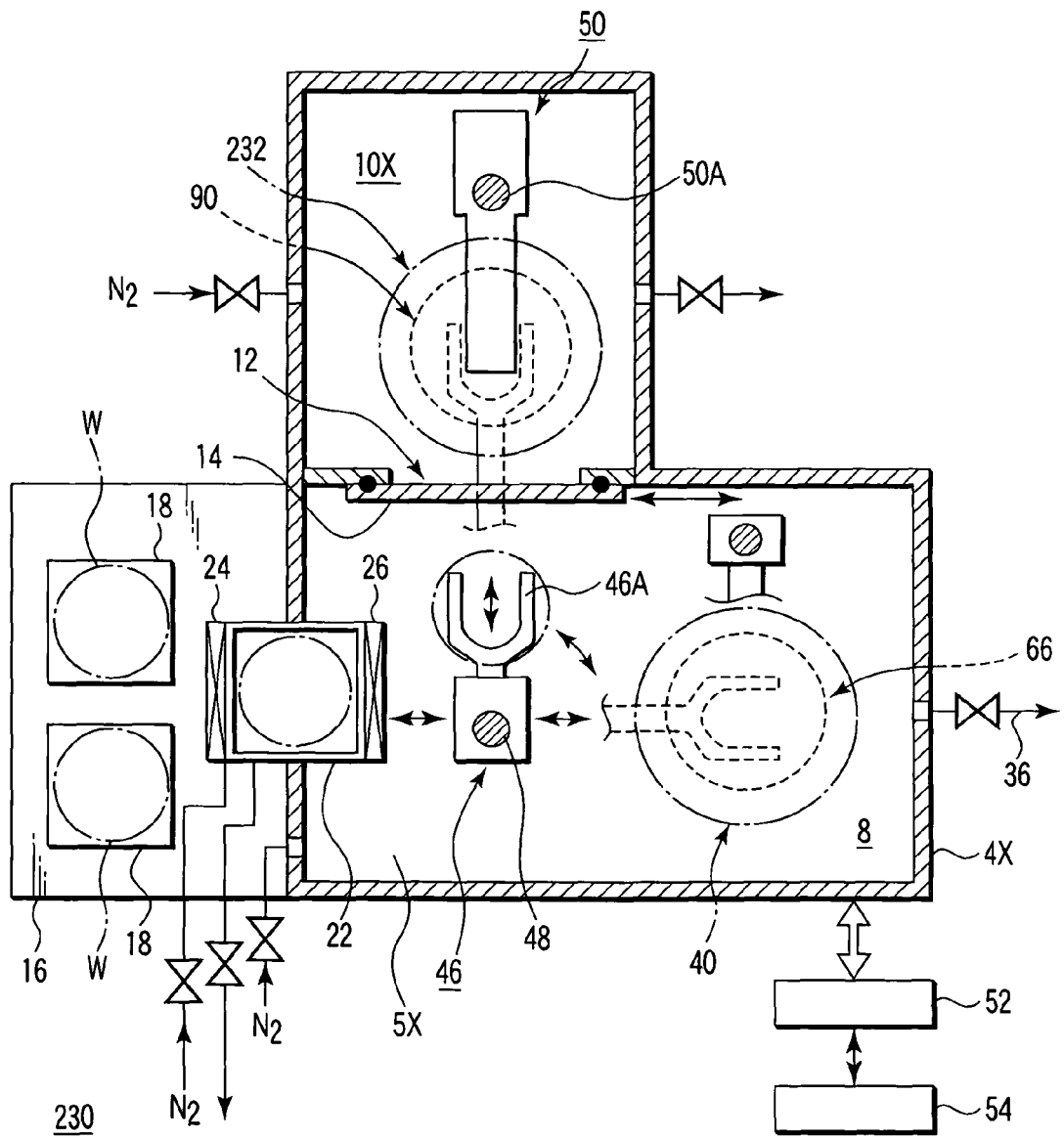
F I G. 14

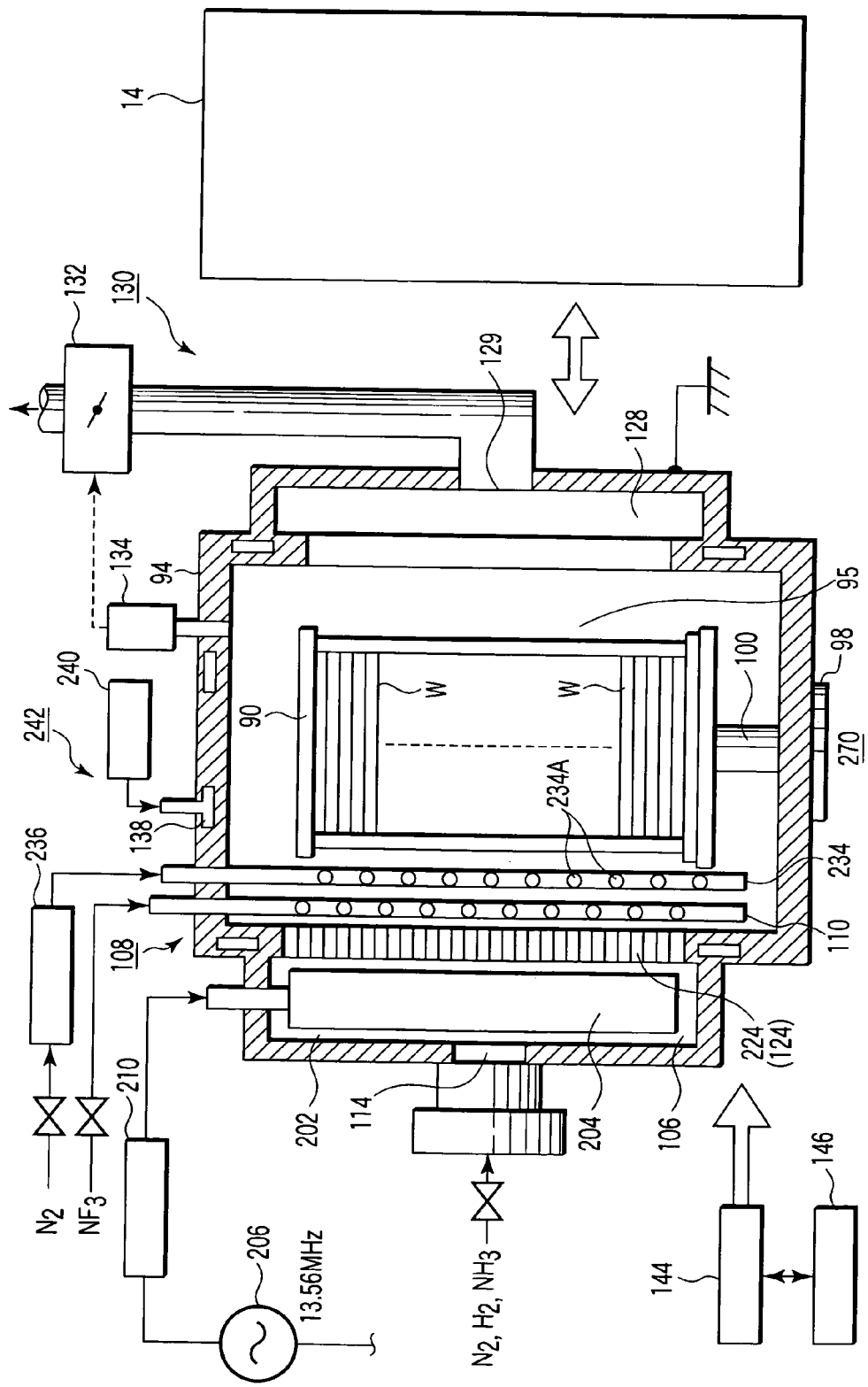
F I G. 20

VERTICAL BATCH PROCESSING APPARATUS

CROSS-REFERENCE TO RELATED APPLICATIONS

This application is based upon and claims the benefit of priority from prior Japanese Patent Application No. 2005-043245, filed Feb. 18, 2005, the entire contents of which are incorporated herein by reference.

BACKGROUND OF THE INVENTION

1. Field of the Invention

The present invention relates to a vertical batch processing apparatus used for removing a semiconductor oxide film present on target objects, such as semiconductor wafers, and a semiconductor processing system including the apparatus. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an LCD (Liquid Crystal Display) or FPD (Flat Panel Display), by forming semiconductor layers, insulating layers, and conductive layers in predetermined patterns on the target object.

2. Description of the Related Art

In manufacturing semiconductor devices for constituting semiconductor integrated circuits, a target object, such as a semiconductor wafer, is subjected to various processes, such as film formation, oxidation, diffusion, reformation, annealing, and etching. A process of this kind may be performed in a vertical processing apparatus (of the so-called batch type). In this case, semiconductor wafers are first transferred from a wafer cassette onto a vertical wafer boat and supported thereon at intervals in the vertical direction. For example, the wafer cassette can store 25 wafers, while the wafer boat can support 30 to 150 wafers. Then, the wafer boat is loaded into a process container from below, and the process container is airtightly closed. Then, a predetermined process is performed, while the process conditions, such as process gas flow rate, process pressure, and process temperature, are controlled.

In recent years, semiconductor integrated circuits are required to have higher operation speed, increased integration and miniaturization, and smaller film thickness. However, for example, in the case of a film formation process for a thin film, such as a gate insulating film, a semiconductor wafer may have a natural oxide film (consisting of $SiO_2$ if the wafer is Si) formed on the surface before the process. The natural oxide film can cause semiconductor devices to have lower electrical characteristics or to be defective. Accordingly, it is preferable to remove the natural oxide film on the surface of the semiconductor wafer to set the wafer surface in an activated state immediately before the process, and then form a film on the wafer surface in this activated state.

As a method for removing a natural oxide film, there is known a method of the wet process type using HF vapor or diluted HF solution to directly remove a natural oxide film. In this case, the wafer surface unfavorably suffers fluorine left thereon. On the other hand, Jpn. Pat. Appln. KOKAI Publication No. 2003-133284 (Patent document 1) discloses a technique of the dry process type to remove a natural oxide film. According to this technique, a fluorine family etching gas, such as $NF_3$, is caused to react with active species (radicals) generated by plasma to produce an intermediate substance ($NH_xF_y$: x and y are positive numbers). Then, the intermediate substance is caused to react with a natural oxide film to form an intermediate film of ammonium silicofluoride [$(NH_4)_2SiF_6$]. Then, the intermediate film is decomposed or sublimated by heating, and is thereby removed as gas.

In the technique disclosed in Patent document 1, a process chamber and a heating chamber are stacked one on the other and configured to selectively communicate with each other. However, the structure and material of an apparatus for forming ammonium silicofluoride are not clarified. Further, the transfer route of a wafer from carry-in through processing to carry-out is not clarified in relation to a system.

Jpn. Pat. Appln. KOKAI Publication No. 2001-284307 (Patent document 2) discloses another related technique. According to the technique disclosed in Patent document 2, a vertical auxiliary chamber is disposed on one side of a vertical reaction chamber to communicate therewith. $H_2$ gas and $N_2$ gas are supplied into the auxiliary chamber and irradiated with microwaves from above to generate plasma. In this case, however, the gases may be insufficiently activated.

Jpn. Pat. Appln. KOKAI Publication No. 2002-100574 (Patent document 3) discloses another related technique. According to the technique disclosed in Patent document 3, active species and an etching gas are supplied into a vertical process chamber through a lateral side. In this case, the interior of the process chamber is exhausted from the bottom, and the gases may less uniformly flow in the process chamber.

BRIEF SUMMARY OF THE INVENTION

An object of the present invention is to provide a vertical batch processing apparatus and semiconductor processing system including the same, which can be used with high reliability to remove a semiconductor oxide film present on target objects, such as semiconductor wafers.

According to a first aspect of the present invention, there is provided a vertical batch processing apparatus configured to transform a semiconductor oxide film on a plurality of target objects into an intermediate film, which is decomposed or sublimated more easily than the semiconductor oxide film, so as to remove the semiconductor oxide film, the apparatus comprising:

a process container configured to form an airtight process field for accommodating the target objects;

a holder configured to support the target objects at intervals in a vertical direction within the process field;

a first process gas supply circuit comprising a first supply port disposed outside the process field, and configured to supply a first process gas to the process field through the first supply port;

a second process gas supply circuit comprising a second supply port disposed between the first supply port and the process field, and configured to supply a second process gas to the process field through the second supply port;

a plasma generation field disposed between the first supply port and the second supply port, and configured to activate the first process gas to produce first active species, wherein the first active species react with the second process gas and thereby produce a reactant to react with the semiconductor oxide film to form the intermediate film; and an exhaust system comprising an exhaust port disposed opposite the second supply port with the process field interposed therebetween, and configured to vacuum-exhaust gas from the process field through the exhaust port.

According to a second aspect of the present invention, there is provided a semiconductor processing system comprising:

a casing configured to form a handling area in an airtight state;

a transfer port unit disposed on the casing to place thereon a transfer container for storing a plurality of target objects, the transfer port unit being configured to allow the transfer container to be opened to the handling area while maintaining an airtight state of the handling area;

a vertical batch main-processing apparatus connected to the casing to perform a semiconductor process on the target objects;

a vertical batch pre-processing apparatus connected to the casing to perform a pre-process on the target objects, the vertical batch pre-processing apparatus being configured to transform a semiconductor oxide film on the target objects into an intermediate film, which is decomposed or sublimated more easily than the semiconductor oxide film, so as to remove the semiconductor oxide film; and a transfer mechanism disposed inside the handling area to directly or indirectly transfer the target objects between the transfer container, the vertical batch main-processing apparatus, and the vertical batch pre-processing apparatus, wherein the vertical batch pre-processing apparatus comprises a process container configured to form an airtight process field for accommodating the target objects, a holder configured to support the target objects at intervals in a vertical direction within the process field, a first process gas supply circuit comprising a first supply port disposed outside the process field, and configured to supply a first process gas to the process field through the first supply port, a second process gas supply circuit comprising a second supply port disposed between the first supply port and the process field, and configured to supply a second process gas to the process field through the second supply port, a plasma generation field disposed between the first supply port and the second supply port, and configured to activate the first process gas to produce first active species, wherein the first active species react with the second process gas and thereby produce a reactant to react with the semiconductor oxide film to form the intermediate film, and an exhaust system comprising an exhaust port disposed opposite the second supply port with the process field interposed therebetween, and configured to vacuum-exhaust gas from the process field through the exhaust port.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 9 is a graph showing the temperature dependency of etching amount for a silicon oxide film and a silicon film;

FIG. 10 is a graph showing the vapor pressure curve of ammonium silicofluoride;

FIG. 14 is a sectional plan view schematically showing the processing system shown in FIG. 13;

FIG. 20 is a sectional side view showing a vertical batch pre-processing apparatus according to a modification of the third embodiment, which may be used in the processing system shown in FIG. 17.

DETAILED DESCRIPTION OF THE INVENTION

Figure 1:
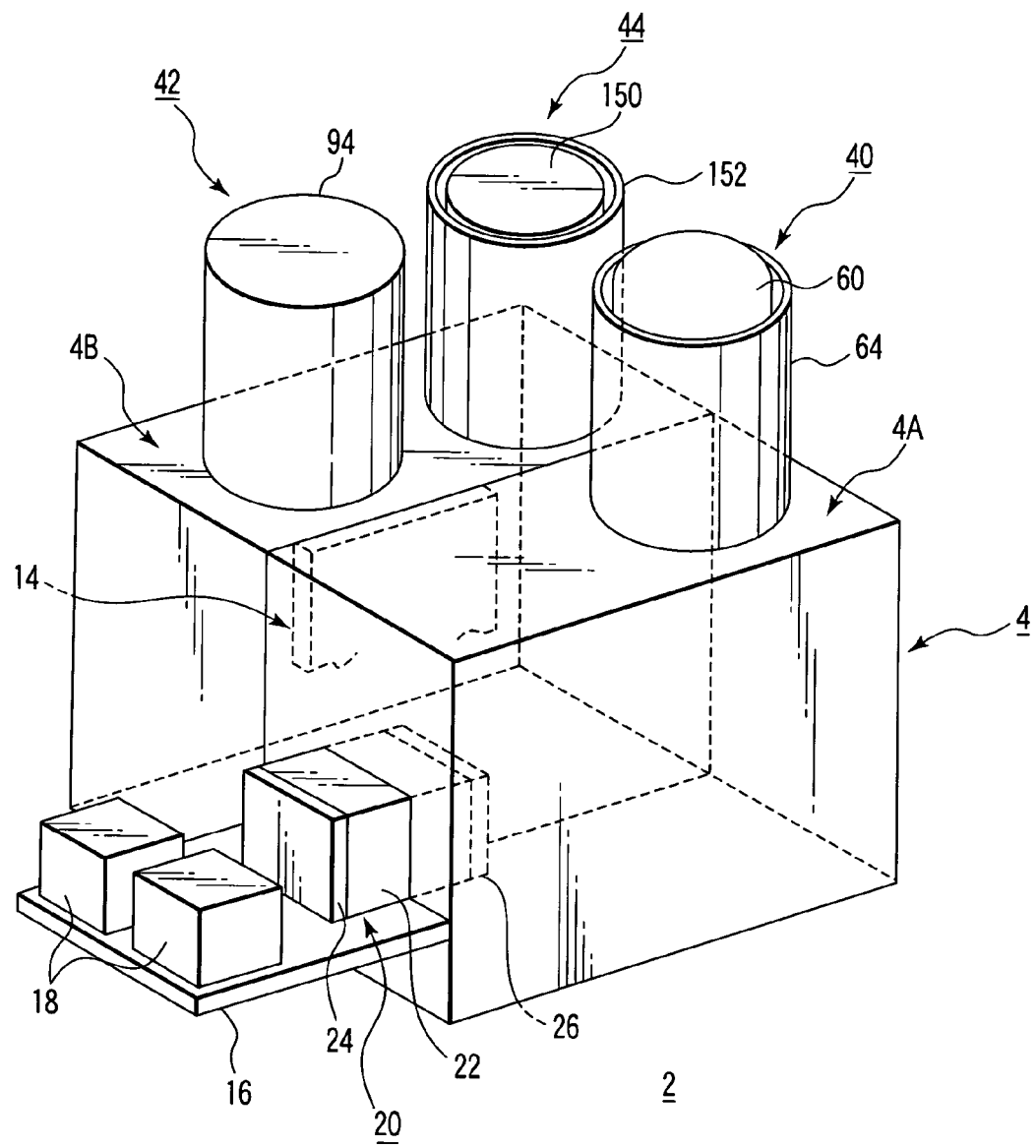
FIG. 1 is a perspective view schematically showing a semiconductor processing system according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

[Semiconductor Processing System]

Figure 2:
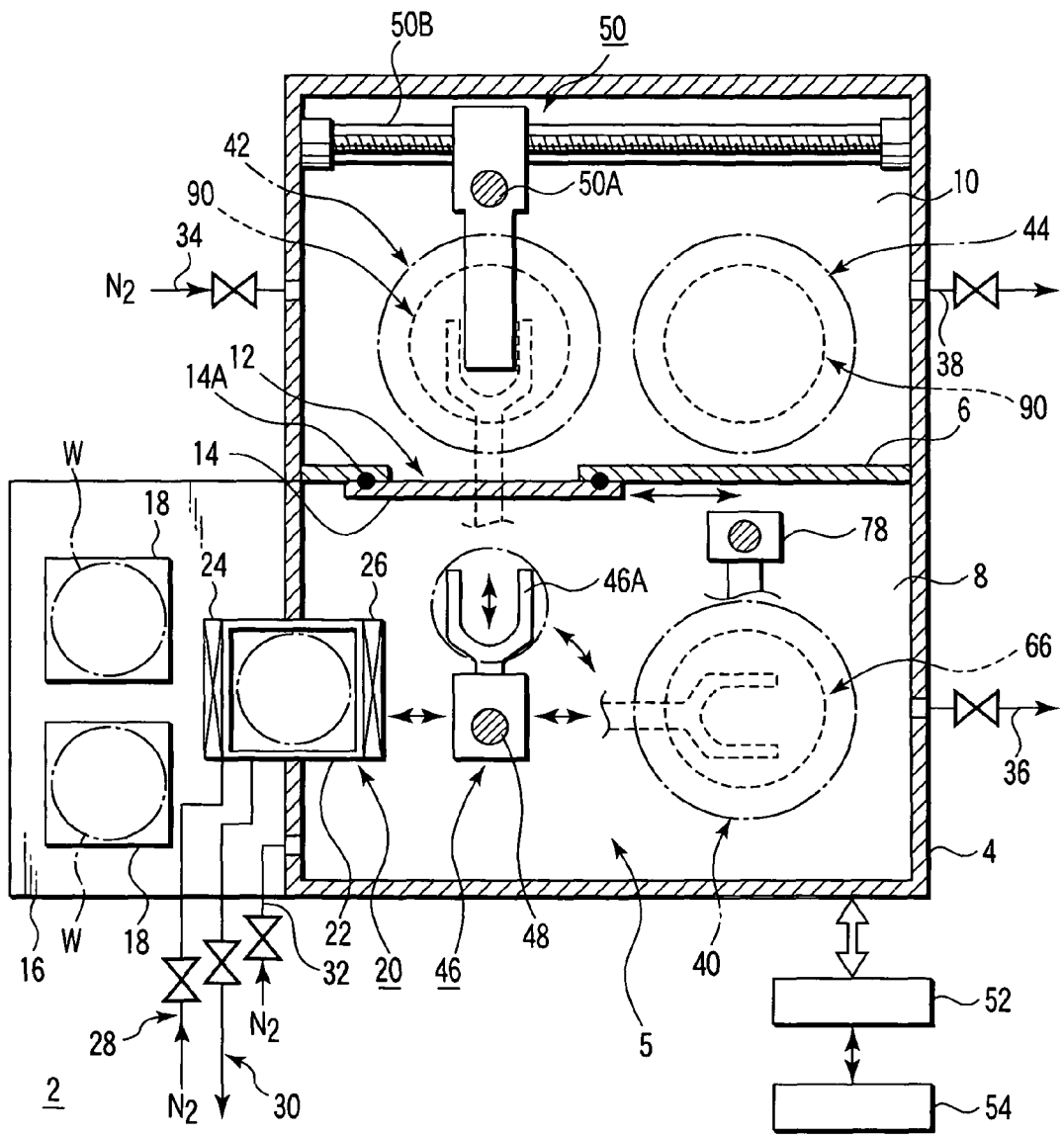
FIG. 2 is a sectional plan view schematically showing the processing system shown in FIG. 1.

FIG. 1 is a perspective view schematically showing a semiconductor processing system according to a first embodiment of the present invention. FIG. 2 is a sectional plan view schematically showing the processing system shown in FIG. 1. As shown in FIGS. 1 and 2, this processing system 2 includes an airtight casing 4 formed of a cubic or rectangular box as a whole. The casing 4 defines therein an airtight handling area 5 for handling semiconductor wafers (typically made of silicon) as target objects. The casing 4 is made of a metal material, such as aluminum, with the inner surface covered with a corrosion resistant coating, such as an alumite coating (aluminum oxide). The casing 4 may be made of another metal, such as stainless steel.

As shown in FIG. 2, the handling area 5 is airtightly divided by a partition wall 6 into two rooms, i.e., a main-process area 8 and a pre-process area 10. The partition wall 6 is made of a metal material, such as aluminum, with the surface covered with a corrosion resistant coating, such as an alumite coating. The partition wall 6 has an opening 12 with a width to allow the target object or semiconductor wafer to pass therethrough. The opening 12 is arranged to be opened and closed by a slide door 14 connected to a drive portion (not shown). A sealing member 14A, such as an O-ring, is disposed on the periphery of the slide door 14 to keep this portion airtight when the slide door 14 is closed.

An I/O table or shelf board 16 is disposed outside the casing 4, specifically on the front side of the wall defining the main-process area 8. The I/O table 16 is configured to place thereon a cassette or transfer container 18, which can store a plurality of, e.g., 10 to 25, target objects or semiconductor wafers W. In FIGS. 1 and 2, two transfer containers 18 are placed on the I/O table 16.

A transfer port unit 20 is disposed at the wall of the casing 4 between the I/O table 16 and main-process area 8. The transfer port unit 20 is configured to allow the transfer container 18 to be opened to the handling area 5 while keeping the handling area 5 airtight. Specifically, the transfer port unit 20 comprises a load-lock box 22 penetrating the wall of the casing 4. The load-lock box 22 has openings respectively on the opposite sides, which are airtightly closed by gate valves 24 and 26. The size of the interior of load-lock box 22 is set such that it can accommodate the transfer container 18. The gate valve 24 on the atmospheric side is opened when the transfer container 18 is transferred between the I/O table 16 and load-lock box 22. The other gate valve 26 on the main-process area 8 side is opened when wafers W are transferred between the transfer container 18 placed in the load-lock box 22 and the main-process area 8.

The load-lock box 22 is connected to an inactive gas line 28 for supplying therein an inactive gas, such as $N_2$ gas, and is also connected to a vacuum exhaust line 30 for vacuum-exhausting the interior thereof. The main-process area 8 is connected to an inactive gas line 32 for supplying therein an inactive gas, such as $N_2$ gas, and is also connected to a vacuum exhaust line 36 for vacuum-exhausting the interior thereof. The pre-process area 10 is connected to an inactive gas line 34 for supplying therein an inactive gas, such as $N_2$ gas, and is also connected to a vacuum exhaust line 38 for vacuum-exhausting the interior thereof.

A main-processing apparatus (vertical batch main-processing apparatus) 40 for performing a main semiconductor process on wafers W is connected to the ceiling portion of the main-process area 8 on the rear side. For example, the main semiconductor process is a film formation process to form a silicon oxide film used as a gate insulating film, a polycrystalline silicon film used as an electrode, or a selective epitaxial layer, on the surface of the wafers W.

On the other hand, a film transformation apparatus (vertical batch pre-processing apparatus) 42 and a heat-processing apparatus (vertical batch heat-processing apparatus) 44 are disposed side by side, each being connected to the ceiling portion of the pre-process area 10. In this embodiment, the film transformation apparatus 42 is disposed on the front side, and the heat-processing apparatus 44 is disposed on the rear side. The film transformation apparatus 42 is configured to perform a process (intermediate film formation step) for transforming a natural oxide film ($SiO_2$) present on the wafer surface into an intermediate film that can be more easily decomposed or sublimated. The heat-processing apparatus 44 is configured to perform a process (intermediate film removal step) for decomposing or sublimating the intermediate film by heating to remove it. The film transformation apparatus 42 and heat-processing apparatus 44 may be implemented in various manners, which will be described later in detail.

The intermediate film formation step and intermediate film removal step are combined to realize a so-called pre-process. With this pre-process, the natural oxide film present on the wafer surface is completely removed, so that the wafer surface comes into an activated state. For example, on this activated wafer surface, a predetermined thin film, such as a gate insulating film, is deposited by the main-processing apparatus 40.

The main-process area 8 is provided with a transfer arm unit 46 therein at a position facing the load-lock box 22 to transfer wafers W between the transfer container 18, main-process area 8, and pre-process area 10. For example, the transfer arm unit 46 comprises an articulated arm that can extend/retract and rotate (pivot). The articulated arm is connected to a vertical drive portion 48, such as a ball screw, and is moved up and down by the drive portion 48. The transfer arm unit 46 has a pick 46A at the distal end to support a wafer W, so as to transfer the wafer W to a wafer boat for the main-processing apparatus 40 or a wafer boat for the film transformation apparatus 42, as described later.

Figure 4:
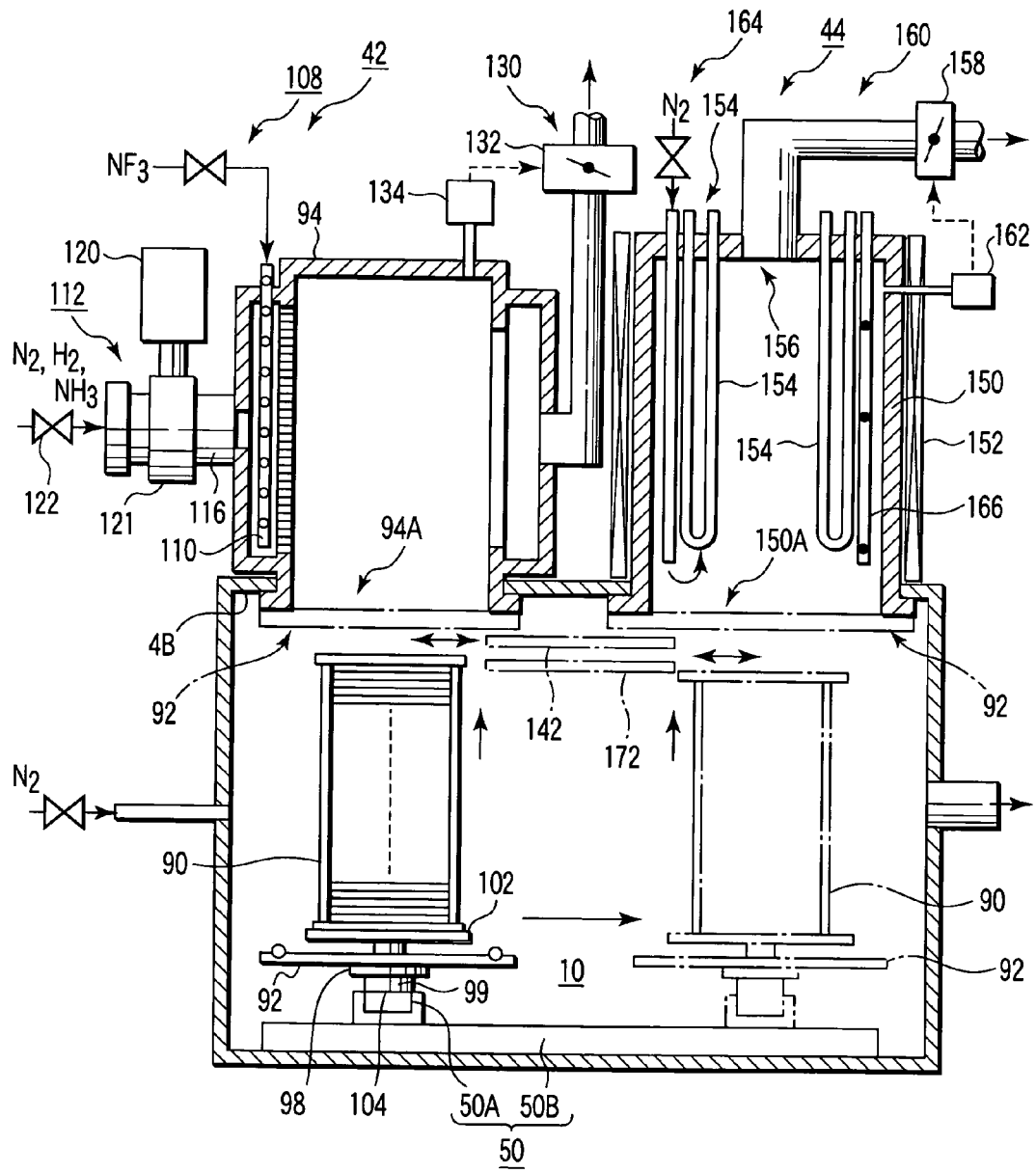
FIG. 4 is a sectional side view of the processing system shown in FIG. 1 viewing from the pre-process area thereof.

FIG. 4 is a sectional side view of the processing system 2 shown in FIG. 1 viewing from the pre-process area 10 thereof. The film transformation apparatus 42 and heat-processing apparatus 44 shares a lid 92 for closing the bottom load port of a process container, and a wafer boat (holder) 90. The wafer boat 90 is configured to support a plurality of, e.g., 20 to 100, wafers W at intervals in the vertical direction, so as to simultaneously subject all the wafers to a certain process. The pre-process area 10 is provided with a boat shifter 50 (see FIG. 2) on the bottom to transfer the lid 92 and wafer boat 90. Specifically, the boat shifter 50 includes a vertical drive portion 50A formed of, e.g., a vertical ball screw for moving the wafer boat 90 and so forth up and down, and a horizontal drive portion 50B formed of, e.g., a horizontal ball screw for moving the vertical drive portion 50A as a whole in a horizontal direction. Accordingly, the boat shifter 50 can move the wafer boat 90 and so forth between the film transformation apparatus 42 and heat-processing apparatus 44, and further load and unload the wafer boat 90 into and from each of the apparatuses 42 and 44.

The processing system 2 further includes a system control section 52 (see FIG. 2) formed of, e.g., a computer, to control the entire system. The system control section 52 has a storage section 54 including a storage medium that stores a program to control the entire operation of the processing system 2. Examples of the storage medium or media are a magnetic disk (flexible disk, hard disk (a representative of which is a hard disk included in the storage section 54), etc.), an optical disk (CD, DVD, etc.), a magneto-optical disk (MO, etc.), and a semiconductor memory. A computer for controlling the operation of the processing system 2 reads program instructions stored in the storage medium or media, and executes them on a processor, thereby performing various processes.

[Main-processing Apparatus]

Figure 3:
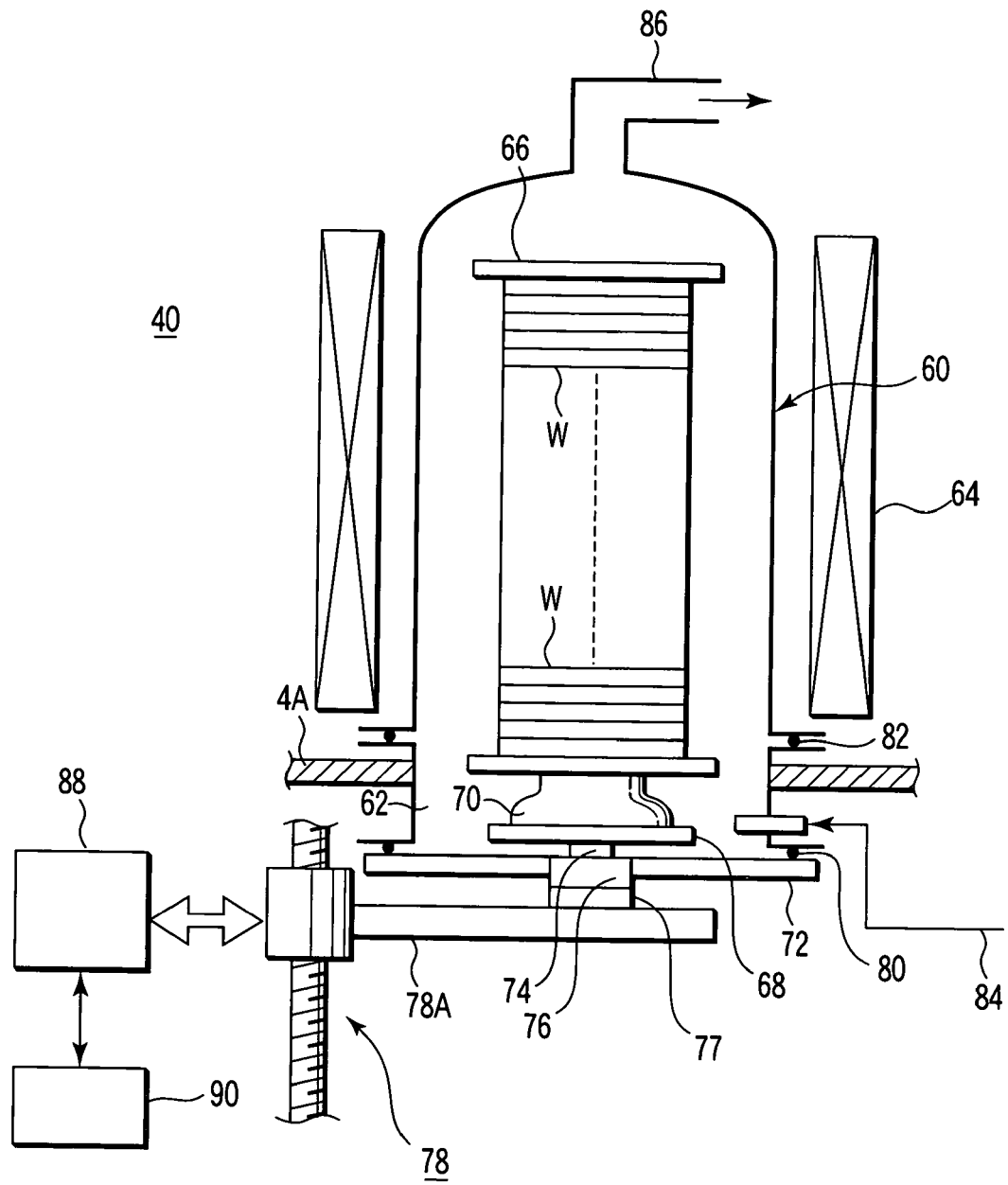
FIG. 3 is a sectional side view schematically showing a vertical batch main-processing apparatus disposed in the processing system shown in FIG. 1.

FIG. 3 is a sectional side view schematically showing the main-processing apparatus (vertical batch main-processing apparatus) 40 of the processing system 2 shown in FIG. 1. The main-processing apparatus 40 is supported by the ceiling board 4A (see FIG. 1) of the main-process area 8 as a whole. In order to form an airtight process field for accommodating wafers W, the main-processing apparatus 40 includes a vertical process container 60 made of quartz, which is cylindrical and opened at the bottom. An exhaust port is formed at the top of the process container 60, and is connected to, e.g., an exhaust line 86 laterally bent at right angles. The exhaust line 86 is connected to a vacuum exhaust system (not shown) including a pressure control valve, a vacuum pump, and so forth provided thereon. The atmosphere within the process container 60 is vacuum-exhausted by this exhaust system.

The bottom of the process container 60 is supported by a cylindrical manifold 62 made of, e.g., stainless steel. A sealing member 82, such as an O-ring, is interposed between the bottom of the process container 60 and the top of the manifold 62 to keep this portion airtight. The manifold 62 has a load port at the bottom to be opened and closed by a lid 72, through which a wafer boat (holder) 66 is loaded and unloaded. The wafer boat 66 is made of quartz, and configured to support a plurality of, e.g., 20 to 100, wafers W at almost regular intervals in the vertical direction.

The wafer boat 66 is placed on a turntable 68 through a heat-insulating cylinder 70 made of quartz. The turntable 68 is supported on the top of a rotary shaft 74, which penetrates the lid 72 used for opening/closing the bottom load port of the manifold 62. The portion of the lid 72 where the rotary shaft 74 penetrates is provided with, e.g., a magnetic-fluid seal 76, so that the rotary shaft 74 is rotatably supported in an airtightly sealed state. A sealing member 80, such as an O-ring, is interposed between the periphery of the lid 72 and the bottom of the manifold 62, so that the interior of the process container 60 can be kept sealed. For example, the rotary shaft 74 is attached to a rotary drive 77 at the distal end of an arm 78A supported by an elevating mechanism 78, such as a boat elevator. The elevating mechanism 78 moves the wafer boat 66 and lid 72 up and down integratedly.

A cylindrical heater 64 is disposed to surround the process container 60. The heater 64 is arranged to heat the atmosphere of the process field within the process container 60, thereby heating up the semiconductor wafers W in the process field. The heater 64 is surrounded by a thermal insulator to ensure thermal stability. The manifold 62 is connected to several gas supply circuits 84 to supply various gases (process gases for film formation and an inactive gas, such as $N_2$ gas) into the process container 60.

The main-processing apparatus 40 further includes a control section 88 formed of, e.g., a computer, to control the entire apparatus. The control section 88 is operated under the control of the system control section 52, and thereby controls the main-processing apparatus 40 to perform a predetermined film formation process on the wafers from which natural oxide films have been removed. The control section 88 can perform a film formation process in accordance with the process recipe of the film formation processes concerning, e.g., the film thickness and composition of a film to be formed, stored in a storage section 90 thereof in advance. In the storage section 90, the relationship between the process gas flow rates and the thickness and composition of the film and so forth are also stored as control data in advance. Accordingly, the control section 88 can control the gas supply circuits, exhaust system, elevating mechanism, heater, and so forth, based on the stored process recipe and control data.

[Film Transformation Apparatus]

Figure 5:
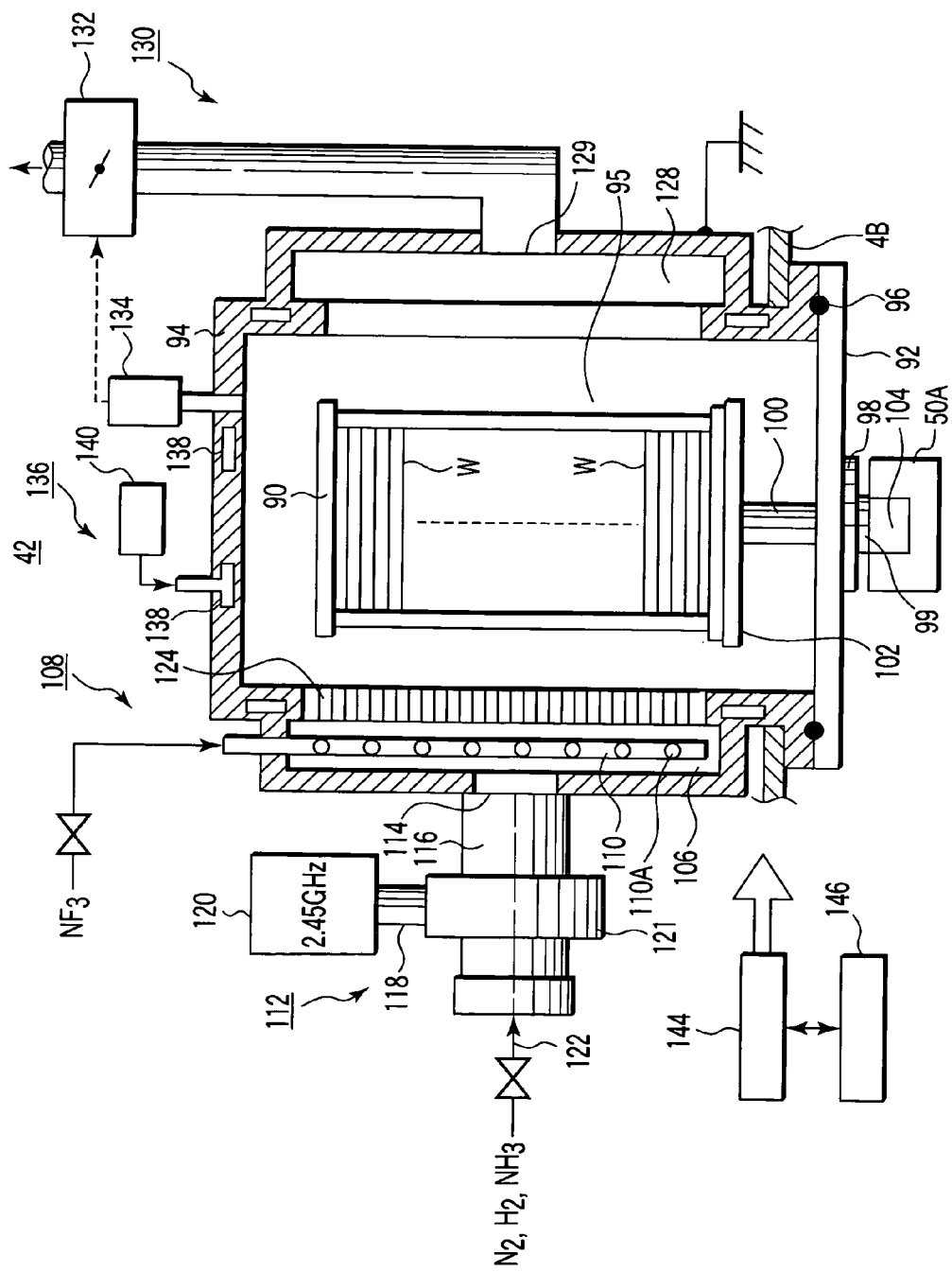
FIG. 5 is a sectional side view showing a film transformation apparatus (vertical batch pre-processing apparatus) disposed in the processing system shown in FIG. 1.
Figure 6:
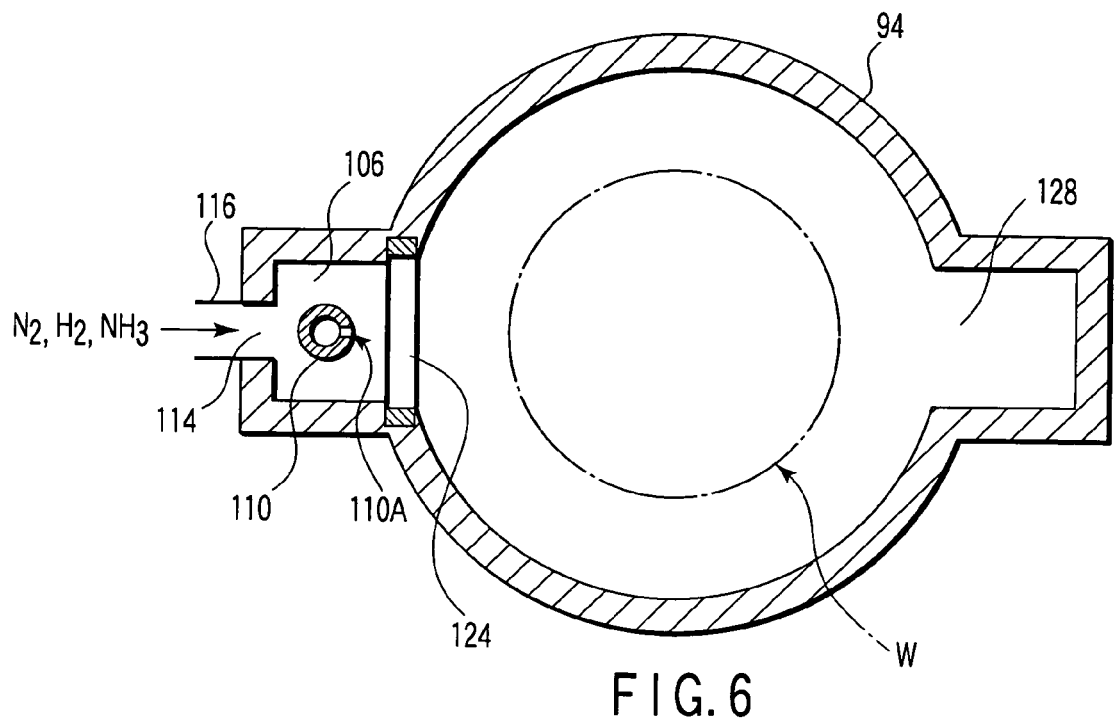
FIG. 6 is a sectional plan view of the film transformation apparatus shown in FIG. 5.

FIG. 5 is a sectional side view showing the film transformation apparatus (vertical batch pre-processing apparatus) 42 disposed in the processing system 2 shown in FIG. 1. FIG. 6 is a sectional plan view of the film transformation apparatus 42 shown in FIG. 5. The film transformation apparatus 42 is supported by the ceiling board 4B (see FIG. 1) of the pre-process area 10 as a whole. In order to form an airtight process field 95 for accommodating wafers W, the film transformation apparatus 42 includes a vertical process container 94, which is cylindrical and opened at the bottom. The process container 94 has a load port 94A (see FIG. 4) at the bottom to be opened and closed by a lid 92, through which a wafer boat (holder) 90 is loaded and unloaded.

Each of the process container 94 and lid 92 is made of a metal material, such as aluminum, with the inner surface covered with a corrosion resistant coating, such as an alumite coating ($Al_2O_3$), which is resistant to a second process gas (a gas containing a halogen element) described later. The process container 94 is grounded. The wafer boat 90 is made of a metal material, such as aluminum, with the surface covered with a corrosion resistant coating, such as an alumite coating, which is resistant to the second process gas. The wafer boat 90 is configured to support a plurality of, e.g., 20 to 100, wafers W at almost regular intervals in the vertical direction.

The wafer boat 90 is placed on a turntable 102 supported on the top of a rotary shaft 100, which penetrates the lid 92. The portion of the lid 92 where the rotary shaft 100 penetrates is provided with, e.g., a magnetic-fluid seal 98, so that the rotary shaft 100 is rotatably supported in an airtightly sealed state. A sealing member 96, such as an O-ring, is interposed between the periphery of the lid 92 and the bottom of the process container 94, so that the interior of the process container 94 can be kept sealed. For example, the rotary shaft 100 is attached to a rotary drive 99 at the distal end of an arm 104 supported by the vertical drive portion 50A of the boat shifter 50. The vertical drive portion 50A moves the wafer boat 90 and lid 92 up and down integratedly.

On one side of the process container 94, a wall portion is integrally attached to and projected outward from the process container 94 to form a vertically long supply head region 106. The supply head region 106 has a length to cover almost the entire length of the wafer boat 90 in the vertical direction. The supply head region 106 is connected to a first gas supply circuit 122 for supplying a first process gas (a gas containing nitrogen atoms and hydrogen atoms) into the process container 94, and is also connected to a second gas supply circuit 108 for supplying a second process gas (a gas containing a halogen element) into the process container 94. The first process gas is supplied in an activated state obtained by plasma into the supply head region 106, while the second process gas is supplied into the supply head region 106 without having been turned into plasma.

The second gas supply circuit 108 is arranged to supply a fluoride gas, such as $NF_3$, at a controlled flow rate, as the second process gas not activated by plasma. Specifically, the second gas supply circuit 108 includes a distribution nozzle 110 extending in the longitudinal direction of the supply head region 106. The distribution nozzle 110 has a plurality of gas holes 100A arrayed in the vertical direction essentially over all the wafers W supported on the boat. The gas holes 110A deliver the second process gas in the horizontal direction, so as to supply the gas toward the center of the process container 94. The distribution nozzle 110 is made of a material resistant to corrosion caused by the first and second process gases, such as aluminum with the surface covered with an alumite coating.

On the other hand, the first gas supply circuit 122 is combined with an active species supply portion 112 to supply active species into the supply head region 106. Specifically, the active species supply portion 112 includes a supply pipe 116 connected to an opening 114 formed at the essential center of the supply head region 106 in the longitudinal direction. The supply pipe 116 has a plasma generation field 121 at the midpoint, which is connected to a microwave generator 120 through a wave guide tube 118. The first gas supply circuit 122 is connected at the end of the supply pipe 114 to supply the first process gas at a controlled flow rate. In the plasma generation field 121, the first process gas is turned into plasma and thereby activated to produce active species by microwaves applied from the microwave generator 120. Active species thus generated are supplied through the opening 114 into the supply head region 106 and diffused in the vertical direction within the region 106.

The microwaves applied from the microwave generator 120 have a frequency of, e.g., 2.45 GHz. Alternatively, the microwaves may have another frequency of, e.g., 400 MHz. For example, the process gas to be turned into plasma (first process gas) is a combination of $N_2$ gas, $H_2$ gas, and $NH_3$ gas. Alternatively, the first process gas may be a combination of $N_2$ gas and $H_2$ gas, or a single gas of $NH_3$ gas.

Active species of $N_2$, $H_2$, and $NH_3$ gases thus generated from the first process gas meet the second process gas or $NF_3$ gas in the supply head region 106. Consequently, a gas reaction takes place to produce an intermediate substance (etchant: $NH_xF_y$: x and y are positive numbers). Then, the intermediate substance reacts with a natural oxide film ($SiO_2$) on the wafers W, thereby forming an intermediate film of ammonium silicofluoride $[(NH_4)_2SiF_6]$, which can be decomposed or sublimated more easily than the natural oxide film.

Figure 7:
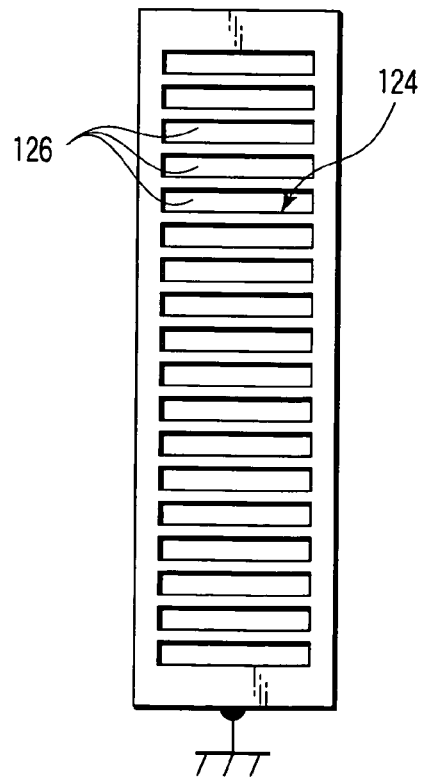
FIG. 7 is a plan view showing a rectifier plate used in the film transformation apparatus shown in FIG. 5.

The vertically long opening portion of the supply head region 106 is provided with a rectifier plate 124 to rectify the flow of the active species and second process gas into a laminar flow state. FIG. 7 is a plan view showing the rectifier plate 124 used in the film transformation apparatus 42 shown in FIG. 5. Specifically, the rectifier plate 124 consists of an aluminum plate having a thickness of, e.g., about 10 mm with a number of gas distribution holes (slit) 126 formed therein at predetermined intervals. The rectifier plate 124 is fitted in and attached to the vertically long opening portion of the supply head region 106. The surface of the rectifier plate 124 is totally covered with, e.g., an alumite coating to increase the corrosion resistant. The entirety of the rectifier plate 124 is grounded. The distribution nozzle 110 may be disposed inside the process container 94 on the inner side of the rectifier plate 124, instead of inside the supply head region 106.

On the opposite side of the process container 94 facing the supply head region 106, a wall portion is integrally attached to and projected outward from the process container 94 to form a vertically long exhaust buffer region 128. The exhaust buffer region 128 has a length to sufficiently cover the entire length of the wafer boat 90 in the vertical direction. The exhaust buffer region 128 is connected through an exhaust port 129 formed at the center to a vacuum exhaust system 130 including a pressure control valve 132, a vacuum pump (not shown), and so forth provided thereon. The vacuum exhaust system 130 is configured to vacuum-exhaust the interior of the process container 94 through the exhaust buffer region 128, and to maintain the interior of the process container at a predetermined vacuum pressure. A pressure gauge 134 is disposed at the ceiling portion of the process container 94, so that the pressure control valve 132 is controlled on the basis of measurement performed by the pressure gauge 134.

The process container 94 is provided with a cooling mechanism 136 to cool the container wall. Specifically, the cooling mechanism 136 includes a thermal medium passage 138 formed in the wall of the process container 94. A cooling medium is supplied from the cooling medium source 140 into the thermal medium passage 138 to cool the process container 94 and maintain it at a predetermined temperature. A shutter member 142 (see FIG. 4) is disposed near the load port 94A at the bottom of the process container 94, and is driven by a slide mechanism (not shown). The shutter member 142 is used to cover the load port 94A, when the lid 92 is positioned down after the wafer boat 90 is unloaded.

The film transformation apparatus 42 further includes a control section 144 formed of, e.g., a computer, to control the entire apparatus. The control section 144 is operated under the control of the system control section 52, and thereby controls the film transformation apparatus 42 to perform a process of transforming a natural oxide film on the wafer surfaces into an intermediate film. The control section 144 can perform a predetermined transformation process in accordance with the process recipe stored in a storage section 140 thereof in advance. In the storage section 140, the relationship between the process gas flow rates and process progress and so forth are also stored as control data in advance. Accordingly, the control section 144 can control the gas supply circuits, exhaust system, plasma generation system, elevating mechanism, and so forth, based on the stored process recipe and control data.

[Heat-processing Apparatus]

Figure 8:
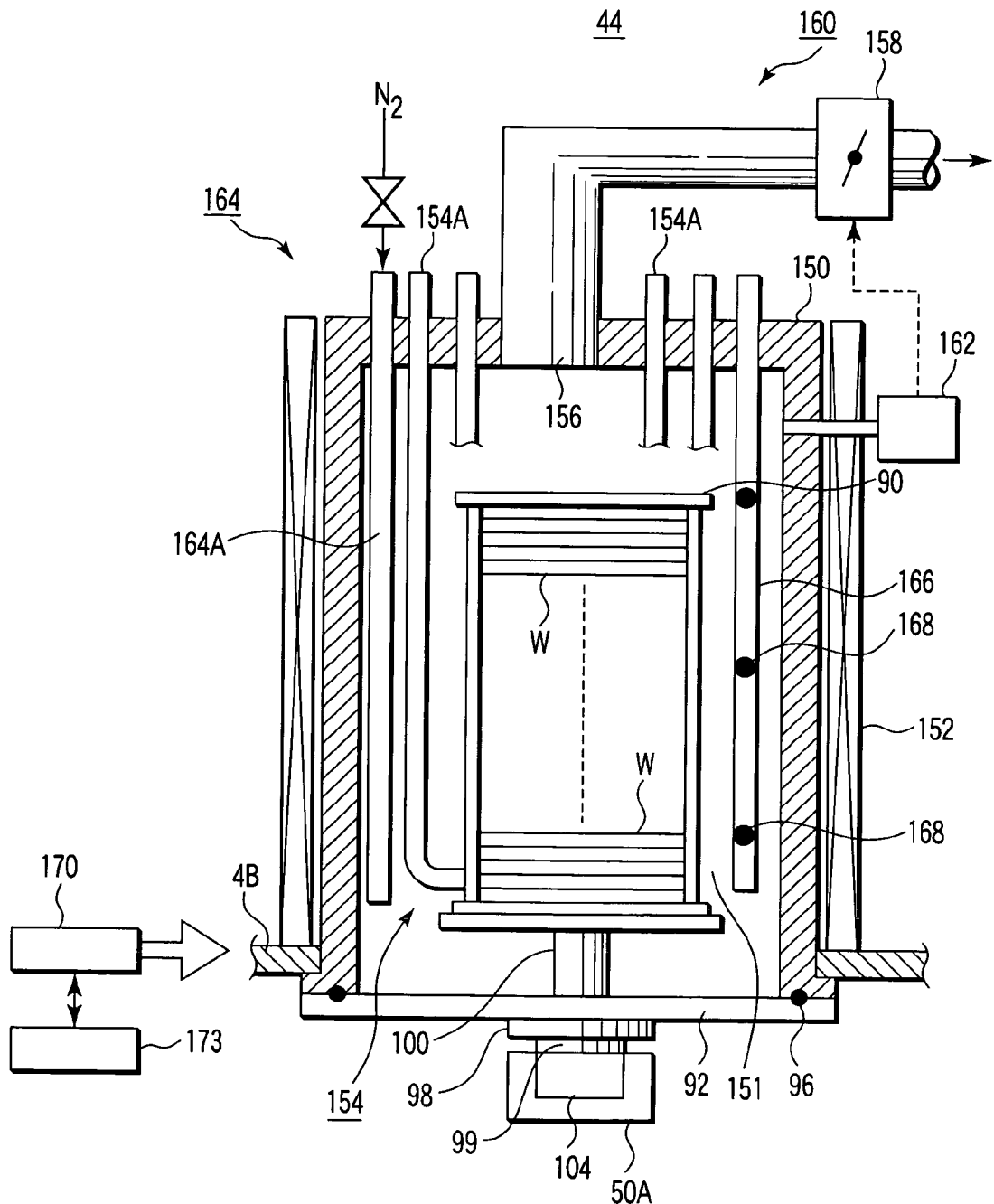
FIG. 8 is a sectional side view showing a heat-processing apparatus disposed in the processing system shown in FIG. 1.

FIG. 8 is a sectional side view showing the heat-processing apparatus (vertical batch heat-processing apparatus) 44 disposed in the processing system 2 shown in FIG. 1. The heat-processing apparatus 44 is supported by the ceiling board 4B (see FIG. 1) of the pre-process area 10 as a whole. In order to form an airtight heat-process field 151 for accommodating wafers W, the heat-processing apparatus 44 includes a vertical process container 150, which is cylindrical and opened at the bottom. The process container 150 has a load port 150A (see FIG. 4) at the bottom to be opened and closed by a lid 92, through which a wafer boat (holder) 90 is loaded and unloaded.

The process container 150 is made of a metal material, such as aluminum, with the inner surface covered with a corrosion resistant coating, such as an alumite coating ($Al_2O_3$). However, since this apparatus does not use the second process gas, which can etch quartz, the process container 150 may be made of quartz ($SiO_2$) or another metal material, such as stainless steel. The process container 150 shares the lid 92, turntable 102, wafer boat 90, and so forth with the film transformation apparatus 42, as described above. The sealing member 96, such as an O-ring, is interposed between the periphery of the lid 92 and the bottom of the process container 150, so that the interior of the process container 150 can be kept sealed.

A cylindrical outer heater 152 is disposed around the process container 150 and extended along the heat-process field 151. The outer heater 152 is mainly used for directly heating the process container 150 from outside. An inner heater 154 is disposed inside the process container 150 and extended along the heat-process field 151, i.e., to surround the wafer boat 90 loaded therein. The inner heater 154 is used for directly heating the wafers W supported on the wafer boat 90. For example, the inner heater 154 comprises carbon wire heaters 154A, which are heat-resistant and less contaminative to the wafers W. Each of the carbon wire heaters 154A is bent in a U-shape to extend along the process container 150 in the vertical direction, and is supported by the ceiling portion. The process container 150 is provided with a plurality of, e.g., four, carbon wire heaters 154A equidistantly disposed to surround the wafer boat 90. FIG. 4 shows only two of the carbon wire heaters 154A. Since the wafers W are directly heated, as described above, their temperature can be quickly increased to decompose or sublimate and thereby remove the intermediate film of ammonium silicofluoride on the wafer surface.

An exhaust port 156 is formed at the top of the process container 150, and connected to, e.g., an exhaust line 157 laterally bent at right angles. The exhaust line 157 is connected to a vacuum exhaust system 160 including a pressure control valve 158, a vacuum pump (not shown), and so forth provided thereon. The vacuum exhaust system 160 is configured to vacuum-exhaust the interior of the process container 150, and to maintain the interior of the process container at a predetermined vacuum pressure. A pressure gauge 162 is disposed at the sidewall of the process container 150, so that the pressure control valve 158 is controlled on the basis of measurement performed by the pressure gauge 162.

The process container 150 is provided with an inactive gas supply circuit 164 for supplying an inactive gas thereinto. In this embodiment, the inactive gas supply circuit 164 includes a gas nozzle 164A, which penetrates the ceiling portion of the process container 150 and extends toward the container bottom. The gas nozzle 164A is made of, e.g., aluminum with the surface covered with an alumite coating. The inactive gas supply circuit 164 is arranged to supply an inactive gas, such as $N_2$ gas, at a controlled flow rate, toward the bottom of the process container 150.

A quartz tube 166 is inserted from the ceiling portion of the process container 150, and has a plurality of temperature measuring elements 168, such as thermo-couples, built therein at predetermined intervals. The temperature measuring elements 168 are arranged to detect the temperature of the wafers W in respective zones arrayed in the vertical direction. The detective values are input to a control section 170 formed of, e.g., a microcomputer, to control the wafer temperature.

A shutter member 172 (see FIG. 4) is disposed near the load port 150A at the bottom of the process container 150, and is driven by a slide mechanism (not shown). The shutter member 172 is used to cover the load port 150A, when the lid 92 is positioned down after the wafer boat 90 is unloaded.

The heat-processing apparatus 44 further includes a control section 170 formed of, e.g., a computer, to control the entire apparatus. The control section 170 is operated under the control of the system control section 52, and thereby controls the heat-processing apparatus 44 to perform a heat-process for heating and thereby removing the intermediate film on the wafer surface. The control section 170 can perform a predetermined process in accordance with the process recipe stored in a storage section 173 thereof in advance. In the storage section 173, the relationship between the temperature, process gas flow rate, and process progress and so forth are also stored as control data in advance. Accordingly, the control section 170 can control the gas supply circuit, exhaust system, heater, elevating mechanism, and so forth, based on the stored process recipe and control data.

[Operation of Semiconductor Processing System]

At first, explanation will be given of the whole process flow for semiconductor wafers W. In the following explanation, it is assumed that the wafers W are silicon substrate wafers. Further, the interior of the casing 4 is set to have an inactive gas atmosphere, such as an $N_2$ atmosphere, as a whole.

As shown in FIGS. 1 and 2, transfer containers 18 that stores wafers W are placed on the I/O table 16 of the processing system 2. Then, one of the transfer containers 18 is carried into the load-lock box 22 through the opened gate valve 24. Then, the gate valve 24 is closed, and the atmosphere inside the load-lock box 22 is replaced with $N_2$ gas. Then, the gate valve 26 on the inner side is opened.

Thereafter, the slide door 14 on the partition wall 6 is opened between the main-process area 8 and pre-process area 10. Then, the transfer arm unit 46 disposed in the main-process area 8 is driven to extend/retract, pivot, and move up and down, so as to transfer the wafers W in the transfer container 18 to the wafer boat 90 (see FIG. 4 as well) positioned below the film transformation apparatus 42. This transfer operation is continued until, e.g., the wafer boat 90 comes into a full load state with wafers W. At this time, a natural oxide film ($SiO_2$) is present on the surface of the wafers W, because they were exposed to clean air during standby.

After the transfer of the wafers W is finished, the slide door 14 is closed. Then, the wafer boat 90 is loaded into the process container 94 of the film transformation apparatus 42 (see FIG. 5) by the vertical drive portion 50A of the boat shifter 50 (see FIG. 2). Then, the transformation process is performed in the process container 94 to transform the natural oxide film on the wafer surface into an intermediate film of ammonium silicofluoride. This transformation process, i.e., the process of forming the intermediate film, will be described later.

After the intermediate film formation step is finished, the wafer boat 90 is moved down by the boat shifter 50 along with the wafers W supported thereon, and is thereby unloaded from process container 94. Then, the wafer boat 90 is horizontally moved to a position below the heat-processing apparatus 44 by the boat shifter 50. Then, the wafer boat 90 is moved up and loaded into the process container 150 of the heat-processing apparatus 44 from below by the boat shifter 50. Then, the wafers W are heated up and maintained at a predetermined temperature within the process container 150 by the outer heater 152 and inner heater 154. Thus, a heat-process is performed to decompose or sublimate and thereby remove the intermediate film on the wafer surface. The gas generated at this time is vacuum-exhausted solely or along with $N_2$ gas supplied into the container. Consequently, the wafer surface comes into an activated state without any natural oxide film attached thereon.

After the intermediate film removal step is finished, the wafer boat 90 is moved down by the boat shifter 50 along with the wafers W supported thereon, and is thereby unloaded from process container 150. Then, the wafer boat 90 is horizontally moved to the home position below the film transformation apparatus 42 by the boat shifter 50, as shown in FIG. 4.

During these serial operations, the slide door 14 on the partition wall 6 is closed to prevent particles or the like generated from the intermediate film and poisonous to wafers W from flowing into the main-process area 8. Further, when the wafer boat 90 is positioned down, the load ports 94A and 150A at the bottom of the process containers 94 and 150 of the film transformation apparatus 42 and heat-processing apparatus 44 are covered with the shutter members 142 and 172, respectively.

Then, the slide door 14 on the partition wall 6 is opened for the main-process area 8 and pre-process area 10 to communicate with each other. Then, the transfer arm unit 46 disposed in the main-process area 8 is driven to transfer all the wafers W on the wafer boat 90 to the wafer boat 66 (see FIG. 3) positioned below the main-processing apparatus 40. After the transfer of the wafers W is finished, the wafer boat 66 is loaded into the process container 60 of the main-processing apparatus 40 to perform the main process on the surface of the wafers W in an activated state, such as a film formation process of, e.g., forming a gate insulating film thereon. For example, the gate insulating film may consist of $SiO_2$ or a high-k (high specific dielectric constant) material, such as HfSiO or $HfO_2$.

After the main process is finished, the wafer boat 66 is moved down and unloaded from process container 60. Then, the wafers W thus processed are transferred by the transfer arm unit 46 into the empty transfer container 18 within the load-lock box 22. After the transfer is finished, the transfer container 18 is carried out onto the outside I/O table 16, thereby completing the operation sequence. As described above, according to the processing system 2, the removal process (pre-process) for removing an oxide film on the target object surface and the main process, such as film formation, can be continuously and efficiently performed. After the surface of the wafers W is set in an activated state by the pre-process, they are immediately transferred through an inactive gas or $N_2$ gas atmosphere within the casing 4 and loaded into the main-processing apparatus 40. Accordingly, the wafer surface never suffers a natural oxide film formed thereon again.

[Operation of Film Transformation Apparatus]

As shown in FIG. 5, the wafer boat 90 is rotated while the interior of the process container 94 is airtightly closed by the lid 92. Further, while the interior of the process container 94 is vacuum-exhausted, $NF_3$ gas used as the second process gas is supplied from the second gas supply circuit 108 into the process container 94. Furthermore, $N_2$ gas, $H_2$ gas, and $NH_3$ gas used as the first process gas are supplied from the first gas supply circuit 122. $NF_3$ gas may be supplied along with an inactive gas, such as $N_2$ gas, used as a carrier gas. The first process gas is turned into plasma within the plasma generation field 121 by microwaves of, e.g., 2.45 GHz transmitted from the microwave generator 120 of the active species supply portion 112. Consequently, the first process gas is activated and active species are thereby generated.

The active species are supplied through the opening 114 into a vertically long supply head region 106 and diffused in the vertical direction within the region 106. Then, the active species are mixed with $NF_3$ gas spouted from the gas holes 110A of the distribution nozzle 110. This mixture gas is rectified by the rectifier plate 124 to be in a laminar flow state and flows in the horizontal direction into the gaps between the wafers W supported on the wafer boat 90. At this time, the mixture gas reacts with a natural oxide film on the surface of the wafers W, and an intermediate film of ammonium silicofluoride is thereby formed, as described later. The residual gas having passed through the gaps between the wafers W enters the vertically long exhaust buffer region 128 on the side opposite to the supply head region 106, and is exhausted out of the apparatus by the vacuum exhaust system 130.

The reaction mechanism at this time proceeds, as follows. Specifically, when active species of the first process gas, such as N*, H*, NH*, $NH_2$*, and $NH_3$* (hereinafter, the symbol "*" denotes active species), react with $NF_3$, an intermediate substance (etchant: $NH_xF_y$: x and y are positive numbers) is produced. Then, the intermediate substance reacts with a natural oxide film ($SiO_2$) to generate an intermediate film of ammonium silicofluoride [$(NH_4)_2SiF_6$] and water ($H_2O$). The ammonium silicofluoride can be decomposed or sublimated more easily than the natural oxide film.

The pressure inside the process container 94 in the film transformation process is set to be within a range of, e.g., about 100 to 400 Pa. During the film transformation process, the mixture gas tends to have a high temperature, and thus the wafers W are likely heated by the mixture gas. However, a cooling medium, such as cooling water, is supplied into the thermal medium passage 138 of the cooling mechanism 136 arranged on the process container 94. Consequently, the wafer temperature can be cooled and maintained around room temperature, such as 20 to 30° C., so that the intermediate film is efficiently formed with high selectivity.

An explanation will be given of the reason as to why the temperature of the wafer W is maintained around room temperature in the film transformation process. FIG. 9 is a graph showing the temperature dependency of etching amount for a silicon oxide film (natural oxide film) and a silicon film (polycrystalline silicon). It should be noted that the term "etching amount" used here means the film thickness of the intermediate film formed by reaction with the etchant described above. In FIG. 9, a line L1 represents the natural oxide film, and a line L2 represents the silicon film.

As shown in FIG. 9, the etching amount for the silicon film is almost constant, regardless of temperature, while the etching amount for the natural oxide film is increased with decrease in the temperature. Accordingly, the selectivity for the silicon film is increased with decrease in the temperature. However, if the wafers W are excessively cooled, the process container 94 of the film transformation apparatus 42 unfavorably suffers dew condensation generated on the outer wall due to moisture in atmosphere. Accordingly, in order to etch the natural oxide film with high selectivity relative to the silicon film (i.e., without damaging the underlying silicon film), the wafer temperature is preferably set to be within a range of about 20 to 30° C.

As described above, according to the film transformation apparatus 42, the natural oxide film on the surface of the wafers W can be efficiently transformed into the intermediate film. The mixture gas of the second process gas with the active species is rectified by the rectifier plate 124 to be in a laminar flow state when it flows from the supply head region 106 toward the center of the process container 94. Consequently, the gas is prevented from forming a turbulent flow, thereby coming into uniform contact with the wafer surface. The members exposed to the atmosphere inside the container, such as the process container 94, lid 92, wafer boat 90, and rectifier plate 124, are made of a metal material, such as aluminum, covered with a corrosion resistant coating, such as an alumite coating, so that they are not corroded. After the processed wafers W are unloaded downward, the load port 94A at the bottom of the process container 94 is covered with the shutter member 142 (see FIG. 4) to prevent particles or the like generated from the intermediate film from scattering.

[Operation of Heat-processing Apparatus]

As shown in FIG. 8, the wafer boat 90 is rotated while the interior of the process container 150 is airtightly closed by the lid 92. Further, while the interior of the process container 150 is vacuum-exhausted, the wafers W are heated up and maintained at a predetermined temperature. In this respect, even when the heat-processing apparatus 44 is in an idling state, the outer heater 152 is maintained in the ON-state, to heat the process container 150 at a certain temperature. Then, when the wafers W are loaded into the process container 150 after they are processed in the film transformation apparatus 42, the inner heater 154 is also turned on to heat up the wafers W. In this case, since the container itself is pre-heated, the temperature of the wafers W can be swiftly increased to a predetermined temperature.

When the wafers W are heated to a high temperature, as described above, the intermediate film of ammonium silicofluoride [$(NH_4)_2SiF_6$] formed on the wafer surface is decomposed to gases, such as SiF4, $NH_3$, HF, and $H_2O$, or directly sublimated to gas, and thereby removed. As a result, the wafer surface is turned into a state where a clean and active silicon surface with hydrogen termination is exposed thereon. During this heat-process, in order to promote exhaust of the decomposition gases or sublimation gas, an inactive gas, such as $N_2$ gas, may be supplied from the inactive gas supply circuit 164 at a controlled flow rate.

The process pressure within this process container 150 during this heat-process is preferably set to be as low as possible, such as about 1 to 1,000 Pa. Further, the wafer temperature is preferably set to be within a range of 150 to 250° C. FIG. 10 is a graph showing the vapor pressure curve of ammonium silicofluoride. As shown in FIG. 10, the higher the temperature is, the larger the decomposition or sublimation rate of ammonium silicofluoride becomes. If the wafer temperature is higher than 250° C., thermal damage is unfavorably caused to various films formed on the wafers in advance. Further, if the wafer temperature is lower than 150° C., the decomposition or sublimation rate is decreased to an unfavorably low level.

The process container 150 is provided with the inner heater 154 comprising the carbon wire heaters 154A. This heater can not only quickly heat up the wafers W to efficiently remove the intermediate film, but also prevent contamination of the wafers W. The process container 150 is made of a metal material, such as aluminum, with the inner surface covered with a corrosion resistant coating, such as an alumite coating, as in the process container 94 of the film transformation apparatus 42. The process container 150 can be thus durable against corrosive gases generated by decomposition or sublimation of the intermediate film. After the processed wafers W are unloaded downward, the load port 150A at the bottom of the process container 150 is covered with the shutter member 172 (see FIG. 4) to prevent heat radiation and particle scattering into the re-process area 10.

Film Transformation Apparatus According to Modification of First Embodiment

Figure 11:
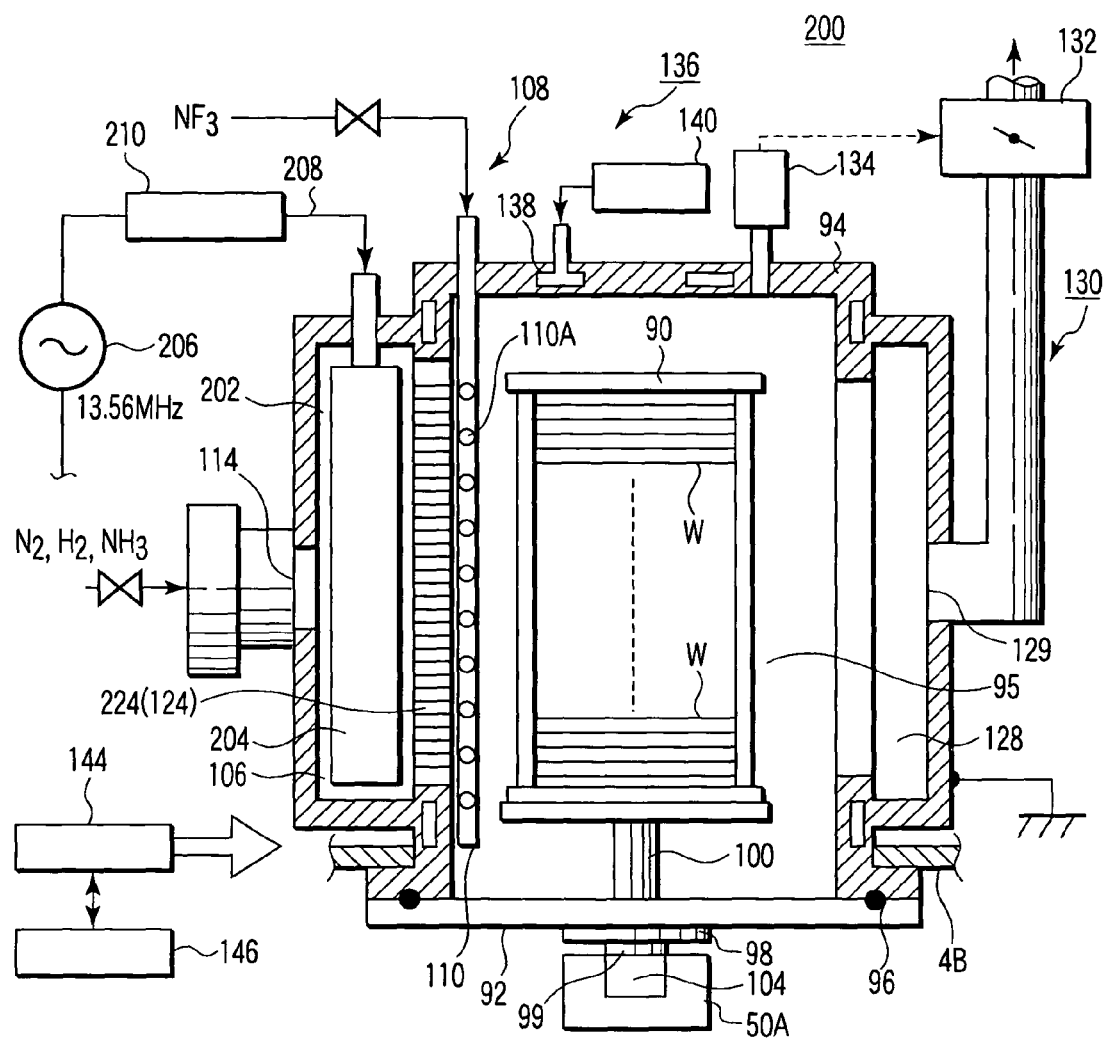
FIG. 11 is a sectional side view showing a film transformation apparatus (vertical batch pre-processing apparatus) according to a modification of the first embodiment, which may be used in the processing system shown in FIG. 1.
Figure 12A:
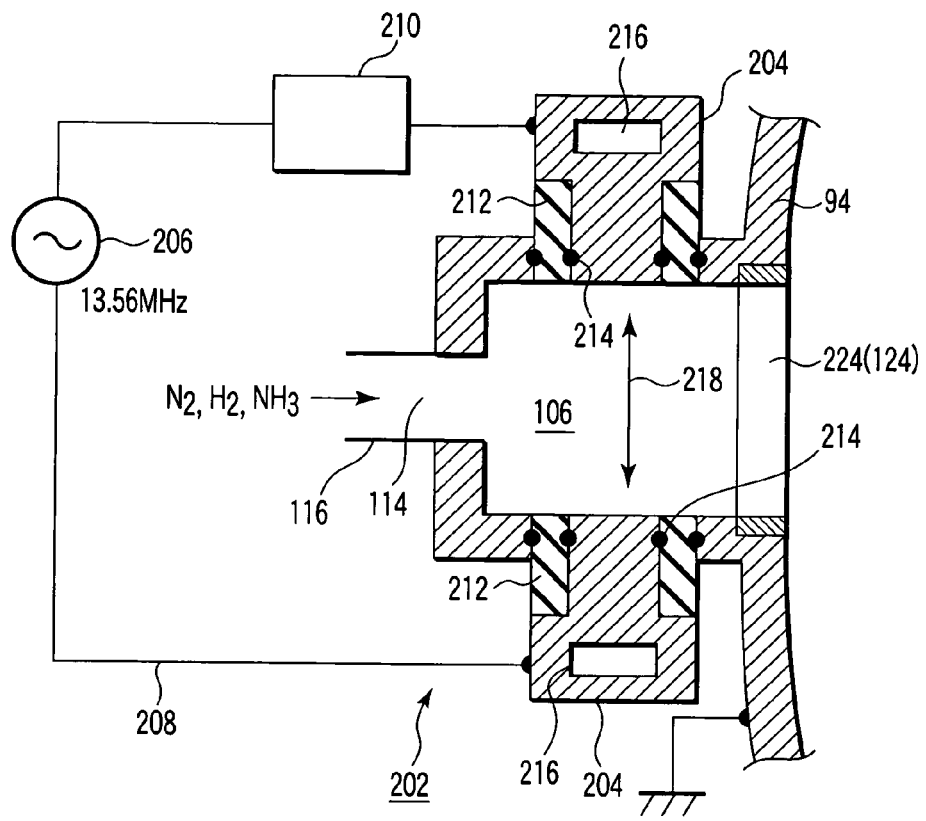
FIGS. 12A and 12B are sectional plan views respectively showing two different structures of a plasma generation field used in the film transformation apparatus shown in FIG. 11.
Figure 12B:
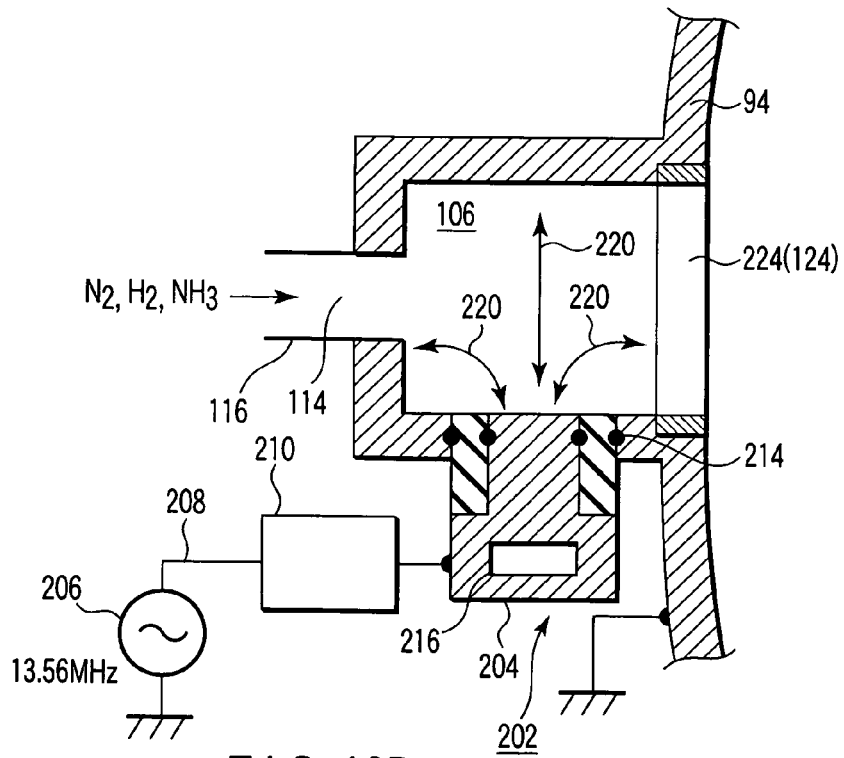

FIG. 11 is a sectional side view showing a film transformation apparatus (vertical batch pre-processing apparatus) 200 according to a modification of the first embodiment, which may be used in the processing system 2 shown in FIG. 1. FIGS. 12A and 12B are sectional plan views respectively showing two different structures of the plasma generation field used in the film transformation apparatus 200 shown in FIG. 11. This modified apparatus 200 has essentially the same structure as the apparatus 42 shown in FIG. 5, except for the process gas supply circuits and plasma generation mechanism. The apparatus 42 shown in FIG. 5 uses microwaves of, e.g., 2.45 GHz to generate plasma, while the apparatus 200 shown in FIG. 11 uses an RF (radio frequency) power of, e.g., 13.56 MHz.

Specifically, in the film transformation apparatus 200, a first process gas comprising $N_2$, $H_2$, and $NH_3$ gases is directly supplied through an opening 114 into a vertically long supply head region 106. Further, the supply head region 106 is also arranged to serve as a plasma generation field 202 for generating plasma and thereby producing active species. Specifically, the plasma generation field 202 includes an electrode 204, which is made of aluminum covered with an alumite-processed surface, and extends in the longitudinal direction of the supply head region 106. The electrode 204 is connected to an RF power supply 206 for applying an RF power of, e.g., 13.56 MHz through a feeder line 208. The feeder line 208 is provided with a matching circuit 210 for impedance alignment to increase the RF plasma generation efficiency.

In one manner, as shown in FIG. 12A, a pair of electrodes 204 are disposed to face each other on the opposite walls forming the supply head region 106. In order to electrically isolate each of the electrodes 204 from the wall of the supply head region 106, an insulating 212 made of, e.g., alumina is interposed between the electrode and wall. Further, a sealing member 214, such as an O-ring, is disposed on either side of each insulating 212 to keep this portion sealed. Each electrode 204 has a cooling water passage 216 formed therein to cool the electrode 204 in operation, thereby preventing the electrode 204 from being overheated by the RF power. An RF power supply 206 is connected to the pair of electrodes 204 through a feeder line 208. Accordingly, as indicated by an arrow 218 in FIG. 12A, an electric field can be formed between the electrodes 204.

In another manner, as shown in FIG. 12B, only one of the electrodes 204 shown in FIG. 12A, e.g., a lower side electrode 204 in this example, is disposed. An RF power supply 206 is connected between the electrode 204 and the grounded process container 94 through a feeder line 208. Accordingly, as indicated by an arrow 220 in FIG. 12B, an electric field can be formed between the electrode 204 and the grounded portion of the process container 94 (including the wall of the supply head region 106 and the rectifier plate (ion shield plate) 124).

The vertically long opening portion of the supply head region 106 is provided with an ion shield plate 224 that is grounded. The ion shield plate 224 prevents plasma generated in the supply head region 106 from leaking into the process container 94. Specifically, the ion shield plate 224 is structured as in the rectifier plate 124 according to the first embodiment. As shown in FIG. 7, the ion shield plate 224 consists of an aluminum plate having a thickness of, e.g., about 10 mm with a number of gas distribution holes 126 formed therein at predetermined intervals. The ion shield plate 224 is fit in and attached to the vertically long opening portion of the supply head region 106. The surface of the ion shield plate 224 is totally covered with, e.g., an alumite coating to increase the corrosion resistance. The entirety of the ion shield plate 224 is grounded.

Since plasma is prevented from leaking from the supply head region 106 by the ion shield plate 224, the wafers W placed in the process container 94 are protected from plasma damage. Further, the gas containing active species is rectified by the ion shield plate 224 into a laminar flow state. The distribution nozzle 110 of the second gas supply circuit 108 is disposed inside the process container 150 on the inner side of the ion shield plate 224, instead of inside the supply head region 106. Accordingly, the second process gas or $NF_3$ gas is not turned into plasma.

The apparatus 200 shown in FIG. 11 provides the same effects as in the apparatus 42 shown in FIG. 5. Specifically, $N_2$ gas, $H_2$ gas, and $NH_3$ gas used as the first process gas are supplied from the first gas supply circuit 122 through the supply pipe 110 into the supply head region 106, and diffused in the vertical direction within the region 106. The first process gas is turned into plasma and thereby activated to produce active species by an RF power applied from the RF power supply 206 to the electrode 204. The active species flow in the horizontal direction while being rectified by the rectifying function of the ion shield plate 224 to be in a laminar flow state. The active species are mixed with $NF_3$ gas delivered from the gas holes 110A of the distribution nozzle 110, and flow in a laminar flow state into the gaps between the wafers W supported on the wafer boat 90. At this time, the mixture gas reacts with a natural oxide film on the surface of the wafers W, and an intermediate film of ammonium silicofluoride is thereby formed, as described previously. The residual gas having passed through the gaps between the wafers W enters the vertically long exhaust buffer region 128 on the side opposite to the supply head region 106, and is exhausted out of the apparatus by the vacuum exhaust system 130.

According to the apparatus 200 shown in FIG. 11, the ion shield plate 224 is disposed on the opening of the supply head region 106 to prevent plasma from leaking from the supply head region 106. With this arrangement, the wafers W placed in the process container 94 are protected from plasma damage. The frequency of the RF power is not limited to 13.56 MHz, and it may be another frequency, such as 27 MHz or 40 MHz.

Second Embodiment

[Semiconductor Processing System]

Figure 13:
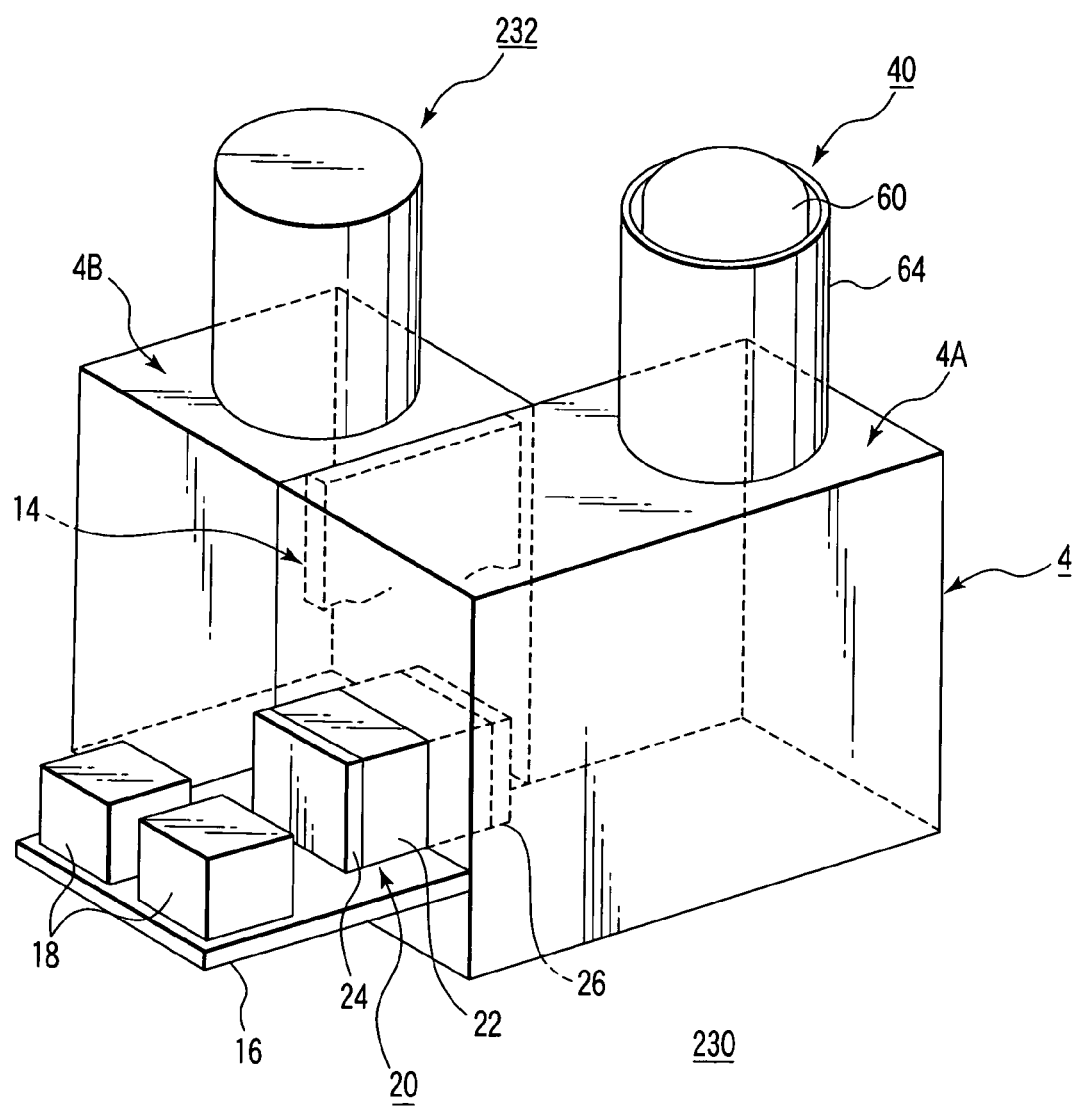
FIG. 13 is a perspective view schematically showing a semiconductor processing system according to a second embodiment of the present invention.

FIG. 13 is a perspective view schematically showing a semiconductor processing system according to a second embodiment of the present invention. FIG. 14 is a sectional plan view schematically showing the processing system shown in FIG. 13. The processing system 230 according to the second embodiment includes a pre-processing apparatus (vertical batch pre-processing apparatus) 232, which is a combination of a film transformation apparatus 42 according to the first embodiment with a heat-processing function.

Specifically, the processing system 230 includes an airtight casing 4X having a shape formed such that the portion corresponding to the heat-processing apparatus 44 (see FIG. 1) is removed from the casing 4 shown in FIG. 1. As shown in FIG. 14, the casing 4X defines therein an airtight handling area 5X for handling semiconductor wafers (typically made of silicon) as target objects. The handling area 5X is formed of a main-process area 8 the same as that shown in FIG. 2, and a pre-process area 10X having a floorage about half of the floorage of the pre-process area 10 shown in FIG. 2. The pre-processing apparatus 232 is connected to the ceiling portion of the pre-process area 10X at a position corresponding to the film transformation apparatus 42 (see FIG. 1). Since the pre-process area 10X is not required to shift a wafer boat 90 in the horizontal direction, it is provided with a boat shifter 50 that has no horizontal drive portion 50B (see FIG. 2) but consists of a vertical drive portion 50A.

In other respects, the processing system 230 is structured almost the same as the processing system 2 according to the first embodiment. Accordingly, the processing system 230 can reduce the equipment cost and occupied area, in addition to providing the same effects as in the processing system 2 according to the first embodiment.

[Pre-processing Apparatus]

Figure 15:
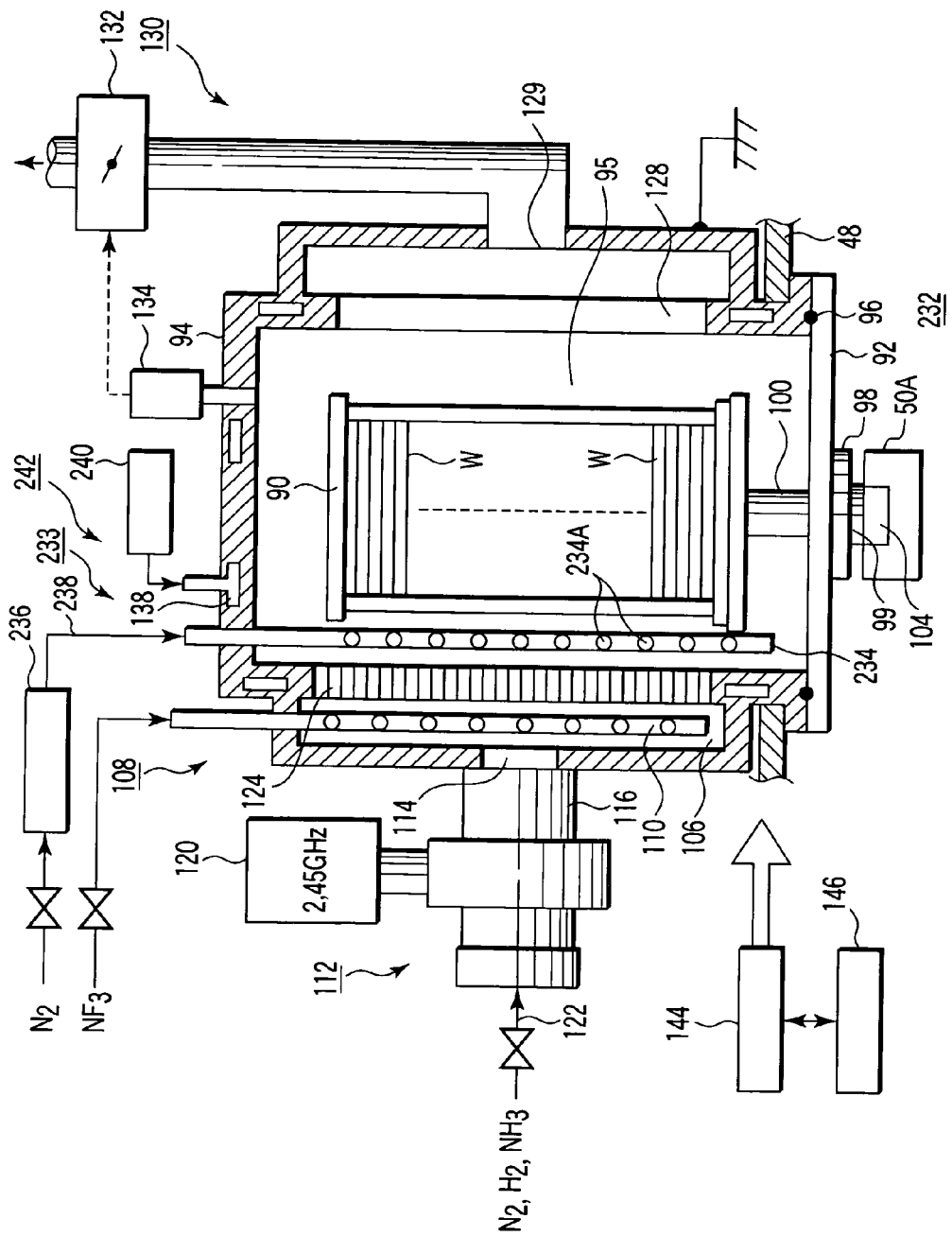
FIG. 15 is a sectional side view showing a vertical batch pre-processing apparatus disposed in the processing system shown in FIG. 13.

FIG. 15 is a sectional side view showing the vertical batch pre-processing apparatus 232 disposed in the processing system 230 shown in FIG. 13. The pre-processing apparatus 232 has essentially the same structure as the film transformation apparatus 42 shown in FIG. 5, and further includes a heated inactive gas supply circuit 233. In other words, the pre-processing apparatus 232 is structured by adding the heated inactive gas supply circuit 233 to the film transformation apparatus 42 shown in FIG. 5.

The heated inactive gas supply circuit 233 includes a distribution nozzle 234 inside the process container 94 on the inner side of the rectifier plate 124. The distribution nozzle 234 has a plurality of gas holes 234A arrayed in the vertical direction essentially over all the wafers W supported on the boat. The gas holes 234A deliver the heated inactive gas in the horizontal direction, so as to supply the gas toward the center of the process container 94. The distribution nozzle 234 is made of a material resistant to corrosion caused by the first and second process gases, such as aluminum with the surface covered with an alumite coating.

The distribution nozzle 234 is connected to a gas line 238 provided with a gas heating unit 236 for heating an inactive gas, such as $N_2$ gas. The gas heating unit 236 is capable of heating $N_2$ gas to a temperature within a range of, e.g., about 800 to 1,000° C.

The process container 94 is provided with a temperature control mechanism 242 to selectively cool and heat the container wall. Specifically, the temperature control mechanism 242 includes a thermal medium passage 138 formed in the wall of the process container 94. A cooling medium and a heating medium are alternatively supplied from the thermal medium source 240 into the thermal medium passage 138 to maintain the process container 94 at a predetermined temperature. For example, the temperature control mechanism 242 supplies the cooling medium while the intermediate film is being formed, and supplies the heating medium while the intermediate film is being removed. The cooling medium may be a chiller.

When the intermediate film formation step is performed, the pre-processing apparatus 232 is operated as in the film transformation apparatus 42 shown FIG. 5, while the heated inactive gas supply circuit 233 is set in the OFF-state. Specifically, the first process gas is supplied from the first gas supply circuit 122, and is activated to produce active species, utilizing plasma generated by microwaves applied from the microwave generator 120. The active species are mixed with the second process gas or $NF_3$ gas supplied from the second gas supply circuit 108, and the mixture gas is delivered from the supply head region 106 and spread over the wafers W. The mixed gas reacts with a natural oxide film ($SiO_2$) on the wafer surfaces to form an intermediate film of ammonium silicofluoride. During this process, the thermal medium source 240 of the temperature control mechanism 242 supplies the cooling medium into the thermal medium passage 138 to cool the process container 94. Consequently, the wafers W are maintained at, e.g., room temperature or a temperature within a range of about 10 to 20° C.

After the intermediate film formation step is performed for a predetermined time, the intermediate film removal step is performed. Specifically, the first and second process gases are stopped, and the microwaves are also stopped. Then, operation of the heated inactive gas supply circuit 233 is started to deliver $N_2$ gas heated at the gas heating unit 236 from the gas holes 234A of the distribution nozzle 234. Consequently, the wafers W are heated to decompose or sublimate and thereby remove the intermediate film.

At this time, for example, $N_2$ gas is heated to about 800 to 1,000 by the gas heating unit 236, so that the wafers W are heated to about 150 to 250° C. Further, the process pressure inside the process container 94 is set at a value within a range of about 100 to 80 kPa, so that the decomposition rate or sublimation rate of the intermediate film is sufficiently large. At this time, the thermal medium source 240 supplies the heating medium in place of the cooling medium into the thermal medium passage 138 to heat the process container 94 to a temperature within a range of, e.g., about 60 to 80° C. Consequently, the decomposition or sublimation of the intermediate film is promoted. After the intermediate film removal step is performed for a predetermined time, the pre-process is completed. Thereafter, the wafers W are processed in the main-processing apparatus 40.

As described above, according to the pre-processing apparatus 232, the intermediate film formation step and intermediate film removal step are serially performed within a single apparatus. Accordingly, the equipment cost is reduced, the throughput is improved, and the occupied area of the processing system 230 is reduced.

Pre-processing Apparatus According to Modification of Second Embodiment

Figure 16:
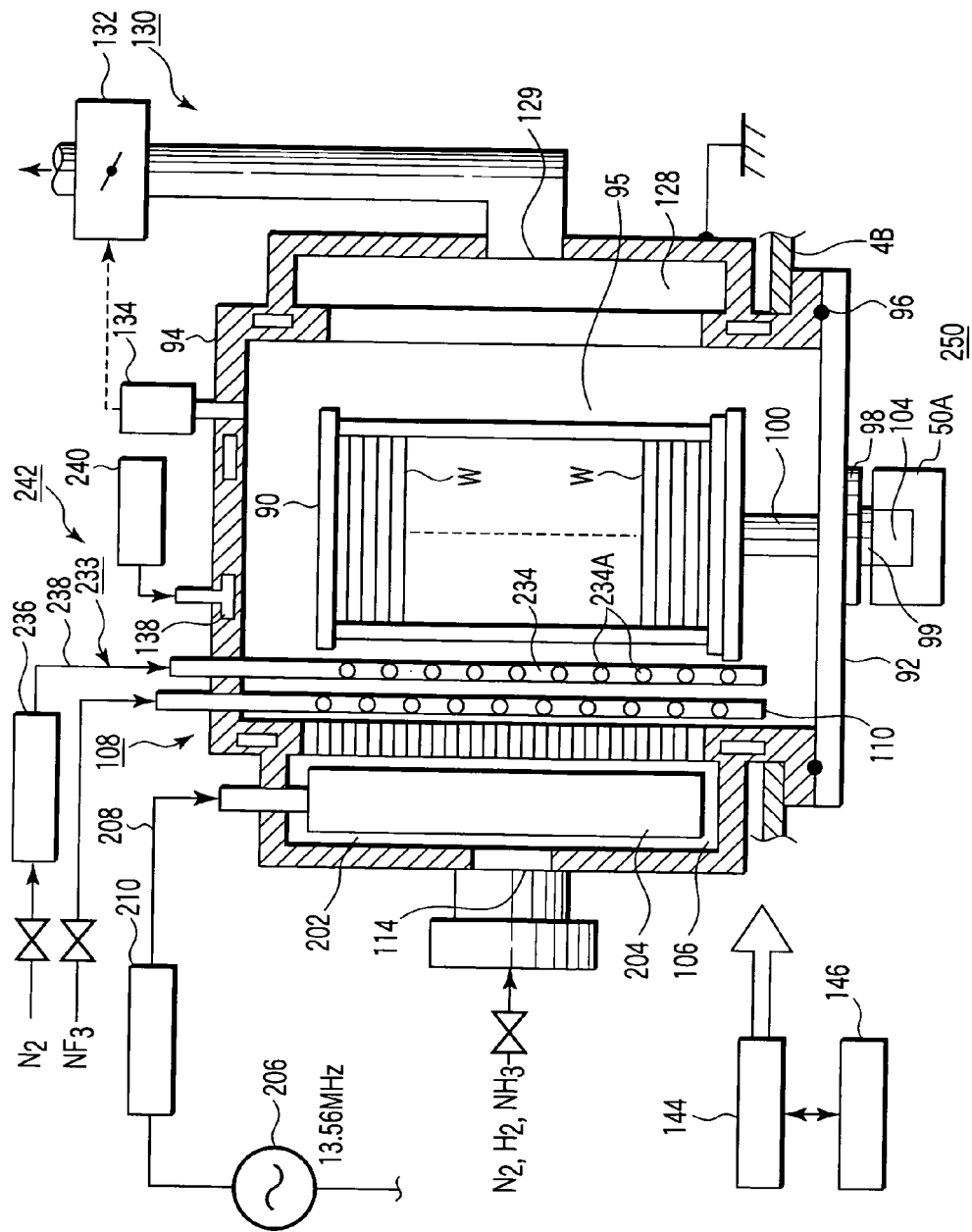
FIG. 16 is a sectional side view showing a vertical batch pre-processing apparatus according to a modification of the second embodiment, which may be used in the processing system shown in FIG. 13.

FIG. 16 is a sectional side view showing a vertical batch pre-processing apparatus 250 according to a modification of the second embodiment, which may be used in the processing system 230 shown in FIG. 13. This modified pre-processing apparatus 250 is structured by adding the heated inactive gas supply circuit 233 and temperature control mechanism 242 described with reference to FIG. 15 to the film transformation apparatus 200 shown in FIG. 11.

The heated inactive gas supply circuit 233 includes a distribution nozzle 234 inside the process container 94 on the inner side of the ion shield plate 224 and next to the second gas supply circuit 108. As described above, the distribution nozzle 234 has a plurality of gas holes 234A to deliver a heated inactive gas, such as $N_2$ gas, during the intermediate film removal step.

When the intermediate film formation step is performed, the pre-processing apparatus 250 is operated as in the film transformation apparatus 200 shown FIG. 11, while the heated inactive gas supply circuit 233 is set in the OFF-state. Specifically, the first process gas is supplied from the first gas supply circuit 122 into the supply head region 106, and is activated to produce active species, utilizing plasma generated by an RF power applied from the RF power supply 206. The active species are delivered through the ion shield plate 224 into the process container 94, and mixed with $NF_3$ gas supplied from the second gas supply circuit 108, so that the mixture gas is spread over the wafers W. The mixed gas reacts with a natural oxide film ($SiO_2$) on the wafer surfaces to form an intermediate film of ammonium silicofluoride. During this process, the thermal medium source 240 of the temperature control mechanism 242 supplies the cooling medium into the thermal medium passage 138 to cool the process container 94. Consequently, the wafers W are maintained at, e.g., room temperature or a temperature within a range of about 10 to 20° C.

After the intermediate film formation step is performed for a predetermined time, the intermediate film removal step is performed. Specifically, the first and second process gases are stopped, and the RF power is also stopped. Then, operation of the heated inactive gas supply circuit 233 is started to deliver $N_2$ gas heated at the gas heating unit 236 from the gas holes 234A of the distribution nozzle 234. Consequently, the wafers W are heated to decompose or sublimate and thereby remove the intermediate film.

At this time, for example, $N_2$ gas is heated to about 800 to 1,000 by the gas heating unit 236, so that the wafers W are heated to about 150 to 25° C. Further, the process pressure inside the process container 94 is set at a value within a range of about 100 to 80 kPa, so that the decomposition rate or sublimation rate of the intermediate film is sufficiently large. At this time, the thermal medium source 240 supplies the heating medium in place of the cooling medium into the thermal medium passage 138 to heat the process container 94 to a temperature within a range of, e.g., about 60 to 80° C. Consequently, the decomposition or sublimation of the intermediate film is promoted. After the intermediate film removal step is performed for a predetermined time, the pre-process is completed. Thereafter, the wafers W are processed in the main-processing apparatus 40.

As described above, according to the pre-processing apparatus 250, the intermediate film formation step and intermediate film removal step are serially performed within a single apparatus. Accordingly, the equipment cost is reduced, the throughput is improved, and the occupied area of the processing system 230 is reduced.

Third Embodiment

[Semiconductor Processing System]

Figure 17:
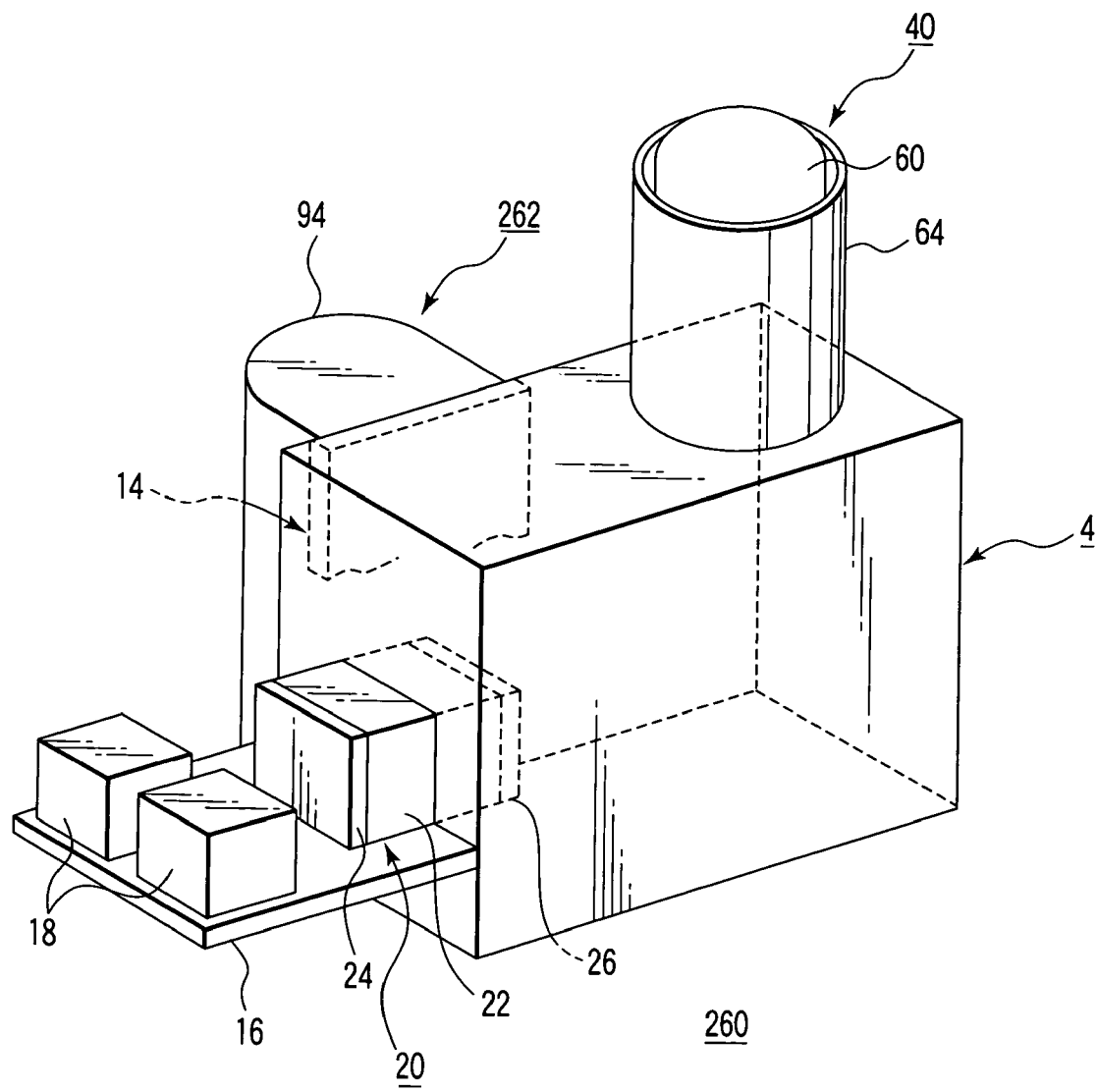
FIG. 17 is a perspective view schematically showing a semiconductor processing system according to a third embodiment of the present invention.
Figure 18:
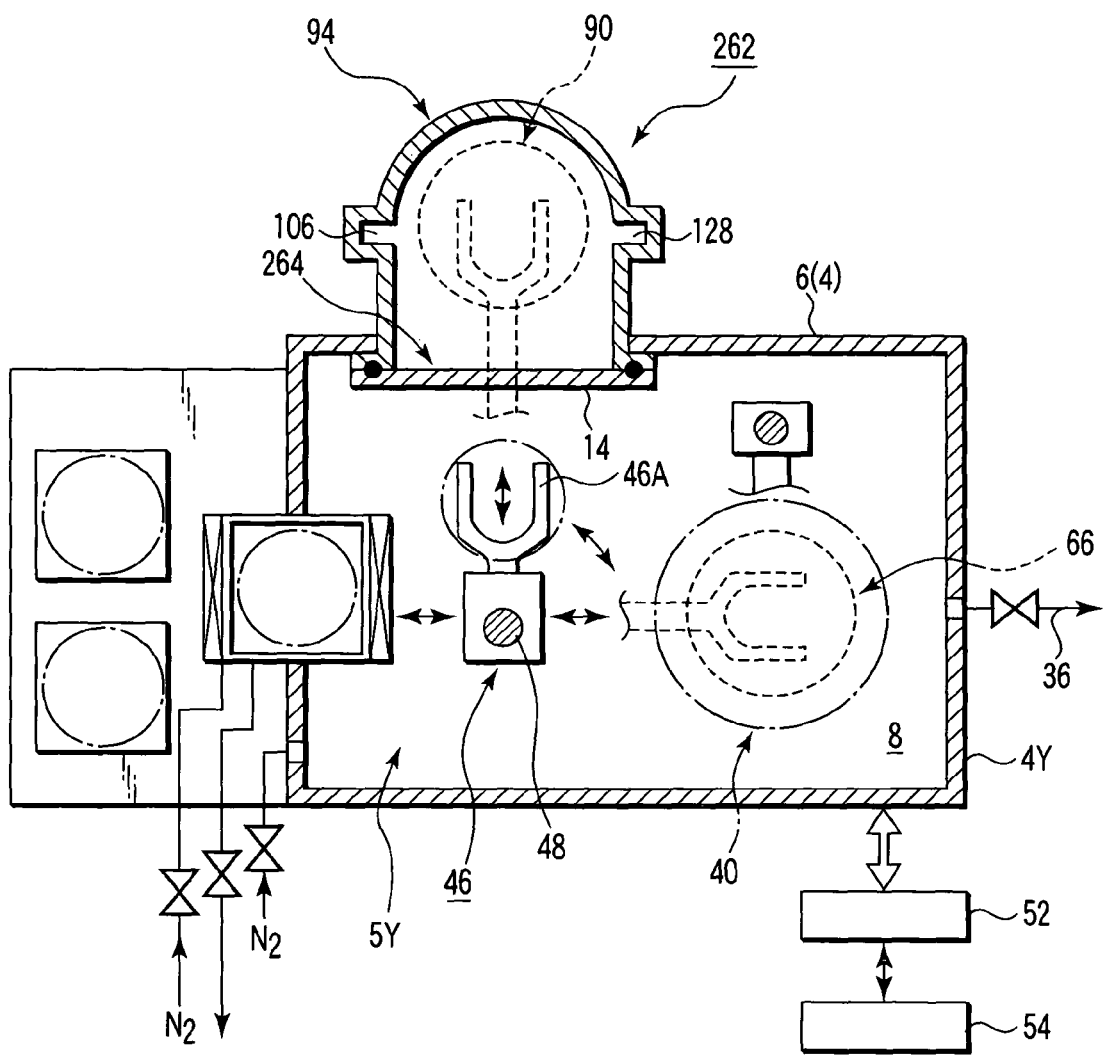
FIG. 18 is a sectional plan view schematically showing the processing system shown in FIG. 17.

FIG. 17 is a perspective view schematically showing a semiconductor processing system according to a third embodiment of the present invention. FIG. 18 is a sectional plan view schematically showing the processing system shown in FIG. 17. The processing system 260 according to the third embodiment includes a pre-processing apparatus 262, which has the same function as the pre-processing apparatus 232 according to the second embodiment, but is disposed on one side of a casing 4Y.

Specifically, the processing system 260 includes an airtight casing 4Y having a shape formed such that the portion corresponding to the pre-process area 10 is removed from the casing 4 shown in FIG. 1. As shown in FIG. 18, the casing 4Y defines therein an airtight handling area 5Y for handling semiconductor wafers (typically made of silicon) as target objects, which is formed only of the same main-process area 8 as that shown in FIG. 2. The pre-processing apparatus 262 is connected to one side of the casing 4Y at a position corresponding to the outside of the slide door 14 of the pre-process area 10 shown in FIG. 2. Since the pre-processing apparatus 262 does not require shifting a wafer boat 90 in either the vertical or horizontal direction, the boat shifter 50 is not disposed.

In other respects, the processing system 260 is structured almost the same as the processing system 2 according to the first embodiment. Accordingly, the processing system 260 can reduce the equipment cost and occupied area, in addition to providing the same effects as in the processing system 2 according to the first embodiment.

[Pre-processing Apparatus]

Figure 19:
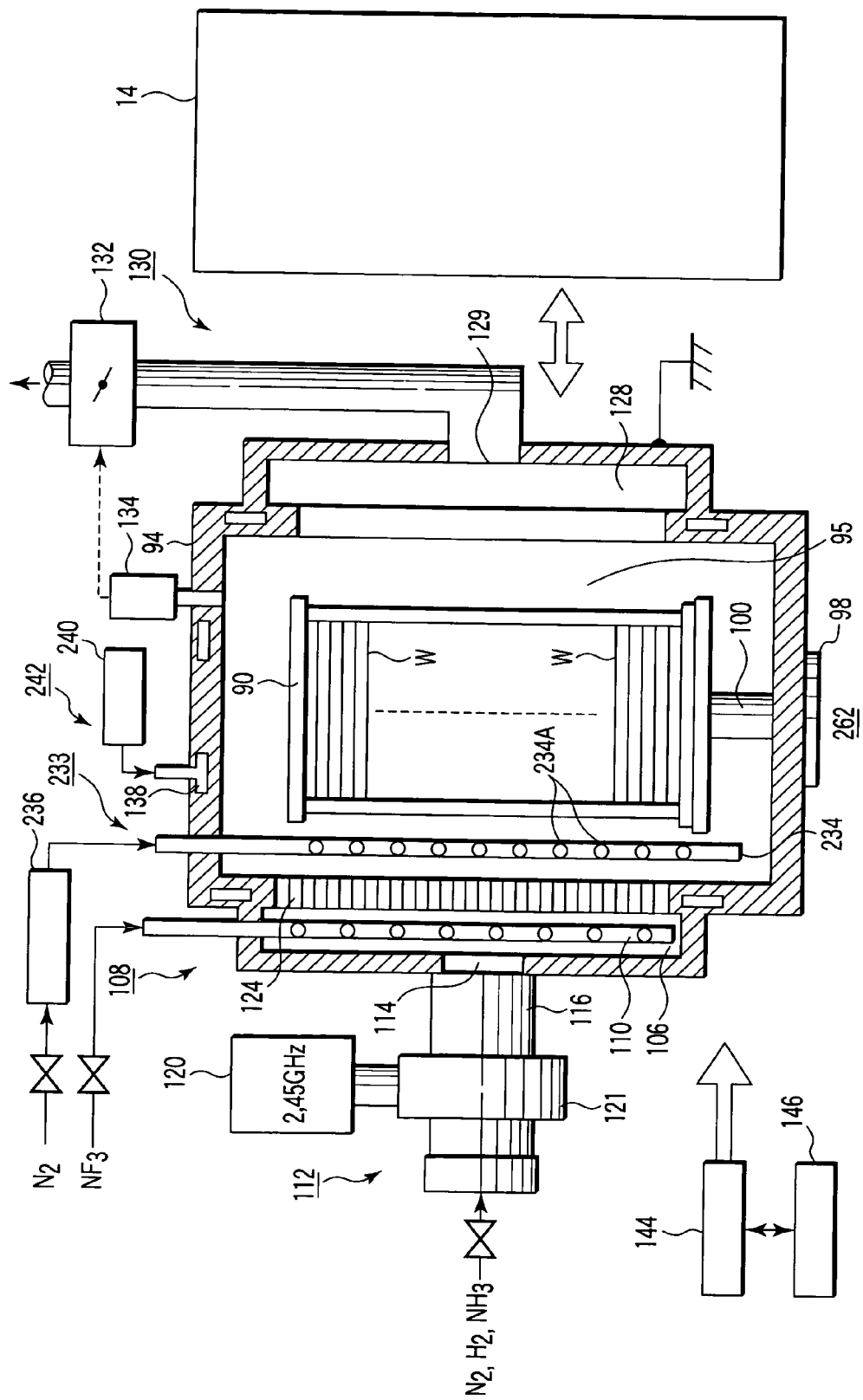
FIG. 19 is a sectional side view showing a vertical batch pre-processing apparatus disposed in the processing system shown in FIG. 17.

FIG. 19 is a sectional side view showing the vertical batch pre-processing apparatus 262 disposed in the processing system 260 shown in FIG. 17. The pre-processing apparatus 262 includes a process container 94 having an essentially semi-elliptic shape in the cross section. The process container 94 has a vertically long load port 264 (see FIG. 18) formed in the side wall, through which the wafers W are loaded and unloaded. The process container 94 is directly attached and fixed to one side of the casing 4Y, so that the load port 264 faces the slide door 14. The slide door 14 is arranged to airtightly close the load port 264 of the process container 94. Since the slide door 14 is a member that partly defines the process container 94, the surface of the slide door 14 to be exposed to the process gases is covered with a corrosion resistant coating, such as an alumite coating.

The wafers W are transferred to and from the wafer boat 90 placed in the process container 94 through the load port 264, which has been opened by moving the slide door 14 in the horizontal direction. The pre-processing apparatus 262 does not require loading or unloading the wafer boat 90 to and from the process container 94. Accordingly, the bottom of process container 94 is closed and provided with a rotary shaft 100 rotatably connected by the magnetic-fluid seal 98. The pre-processing apparatus 262 thus does not need the boat shifter 50 (including the vertical drive portion 50A and horizontal drive portion 50B shown in FIG. 2) necessitated in each of the embodiments described above. Since the whole operation of the pre-processing apparatus 262 is the same as that of the pre-processing apparatus 232 shown in FIG. 15, the description thereon will be omitted.

Pre-processing Apparatus According to Modification of Third Embodiment

FIG. 20 is a sectional side view showing a vertical batch pre-processing apparatus 270 according to a modification of the third embodiment, which may be used in the processing system 260 shown in FIG. 17. This modified pre-processing apparatus 270 is structured by adding the changes described with reference to FIG. 19 to the film transformation apparatus 250 shown in FIG. 16.

The pre-processing apparatus 270 includes a process container 94 having an essentially semi-elliptic shape in the cross section. The process container 94 has a vertically long load port 264 (see FIG. 18) formed in the side wall, through which the wafers W are loaded and unloaded. The process container 94 is directly attached and fixed to one side of the casing 4Y, so that the load port 264 faces the slide door 14. The slide door 14 is arranged to airtightly close the load port 264 of the process container 94. Since the slide door 14 is a member that partly defines the process container 94, the surface of the slide door 14 to be exposed to the process gases is covered with a corrosion resistant coating, such as an alumite coating.

The wafers W are transferred to and from the wafer boat 90 placed in the process container 94 through the load port 264, which has been opened by moving the slide door 14 in the horizontal direction. The pre-processing apparatus 270 does not require loading or unloading the wafer boat 90 to and from the process container 94. Accordingly, the bottom of process container 94 is closed and provided with a rotary shaft 100 rotatably connected by the magnetic-fluid seal 98. Since the whole operation of the pre-processing apparatus 270 is the same as that of the pre-processing apparatus 250 shown in FIG. 16, the description thereon will be omitted.

In the third embodiment, the sectional shape of the process container 94 is not limited to a semi-elliptic shape (see FIGS. 17 and 18), and it may be another shape, such as a square shape in the cross section.

Matters Common to First to Third Embodiments

In the embodiments described above, the transfer port unit 20 is exemplified by a structure using the load-lock box 22. However, for example, there is a case where used as a transfer container 18 is an airtight container filled with $N_2$ gas, such as a SMIFBOX™ or FOOP™. In this case, the transfer port unit 20 may have a structure directed to such a special container. Typically, the door for airtightly closing a transfer port is provided with a drive portion for opening and closing the lid of a SMIFBOX or the like. The SMIFBOX or the like is pressed airtightly against the transfer port, and the lid is detached by the drive portion disposed on the door. Then, the door is moved along with the lid from the transfer port, so that the SMIFBOX or the like is opened in an airtight state to the handling area.

In the embodiments described above, the handling area is entirely filled with an inactive gas ($N_2$). Alternatively, the handling area may be maintained in a vacuum state hardly containing $O_2$ gas components. The present invention may be applied to removal of an $SiO_2$ film formed by a thermal CVD or plasma CVD process, in place of removal of a natural oxide film. The second process gas is not limited to $NF_3$ gas, and it may be another gas containing a halogen element, such as $N_2F_4$ (tetrafluorohydrazine). Further, the inactive gas used here is not limited to $N_2$ gas, and it may be another inactive gas, such as Ar gas or He gas. The main process performed by the main-processing apparatus 40 is not limited to a film formation process, and the present invention may be applied to various processes which require performing a process on an activated wafer surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing system comprising:
a casing configured to form a handling area in an airtight state, the handling area comprising a main-process area and a pre-process area airtightly divided from each other by a partition wall and connected through a connection port to be opened and closed by a partition door, the main-process area and the pre-process area being respectively connected to their own lines for vacuum-exhausting gas therefrom and their own lines for supplying an inactive gas thereinto and thereby configured to adjust pressure therein independently of each other;
a transfer port unit disposed on the casing to place thereon a transfer container for storing a plurality of target objects, the transfer port unit being configured to allow the transfer container to be opened to the main-process area while maintaining an airtight state of the main-process area;
a vertical batch main-processing apparatus connected to the main-process area and configured to perform a semiconductor process on the target objects;
a vertical batch pre-processing apparatus connected to the pre-process area and configured to perform a pre-process on the target objects, the vertical batch pre-processing apparatus being configured to transform a semiconductor oxide film on the target objects into an intermediate film, which is decomposed or sublimated more easily than the semiconductor oxide film, so as to remove the semiconductor oxide film;
a vertical batch heat-processing apparatus connected to the pre-process area and configured to heat the target objects to decompose or sublimate the intermediate film; and
a transfer mechanism disposed inside the handling area to directly or indirectly transfer the target objects between the transfer container, the vertical batch main-processing apparatus, the vertical batch pre-processing apparatus, and the vertical batch heat-processing apparatus,
wherein the vertical batch main-processing apparatus comprises
an airtight main process container configured to accommodate the target objects,
a first holder configured to support the target objects at intervals in a vertical direction within the main process container,
a gas supply system configured to supply a main process gas for performing the semiconductor process into the main process container, and
an exhaust system configured to vacuum-exhaust gas from inside the main process container,
wherein the vertical batch pre-processing apparatus comprises
a pre-process container configured to form an airtight process field for accommodating the target objects, a second holder other than the first holder and configured to support the target objects at intervals in a vertical direction within the process field, a first process gas supply circuit comprising a first supply port disposed outside the process field, and configured to supply a first process gas to the process field through the first supply port, a second process gas supply circuit comprising a second supply port disposed between the first supply port and the process field, and configured to supply a second process gas to the process field through the second supply port, a plasma generation field disposed between the first supply port and the second supply port, and configured to activate the first process gas to produce first active species, wherein the first active species react with the second process gas and thereby produce a reactant to react with the semiconductor oxide film to form the intermediate film, and an exhaust system comprising an exhaust port disposed opposite the second supply port with the process field interposed therebetween, and configured to vacuum-exhaust gas from the process field through the exhaust port, wherein the vertical batch heat-processing apparatus comprises an airtight heat-process container configured to accommodate the target objects by accommodating the second holder therein, a heater configured to heat the target objects supported on the second holder, and an exhaust system configured to vacuum-exhaust gas from inside the heat-process container, and wherein the transfer mechanism comprises a transfer arm configured to directly transfer the target objects between the transfer container, the first holder, and the second holder, and a holder shifter configured to transfer the second holder with the target objects supported thereon between the vertical batch pre-processing apparatus and the vertical batch heat-processing apparatus.

2. The semiconductor processing system according to claim 1, wherein a supply head region is formed on a lateral side of the process field by a first wall portion integratedly attached to the pre-process container, and the first active species are supplied from the supply head region to the process field.

3. The semiconductor processing system according to claim 2, wherein a rectifier plate is disposed between the supply head region and the process field to rectify a gas flow into a laminar flow state, and comprises a plurality of slits arrayed essentially over all the target objects in a vertical direction.

4. The semiconductor processing system according to claim 2, wherein an ion shield plate is disposed between the supply head region and the process field to prevent plasma from passing therethrough.

5. The semiconductor processing system according to claim 4, wherein the ion shield plate is configured to rectify a gas flow into a laminar flow state, and comprises a plurality of slits arrayed essentially over all the target objects in a vertical direction.

6. The semiconductor processing system according to claim 2, wherein the first supply port is disposed outside the supply head region, the plasma generation field is disposed between the first supply port and the supply head region, and the second supply port is opened into the supply head region.

7. The semiconductor processing system according to claim 2, wherein the first supply port is opened into the supply head region, the plasma generation field is disposed inside the supply head region, and the second supply port is disposed between the supply head region and the process field.

8. The semiconductor processing system according to claim 2, wherein an exhaust buffer region is formed on a lateral side of the process field by a second wall portion integratedly attached to the pre-process container opposite the first wall portion, and the exhaust port is connected to the exhaust buffer region.

9. The semiconductor processing system according to claim 1, wherein the plasma generation field is configured to activate the first process gas by microwaves applied from a microwave generator.

10. The semiconductor processing system according to claim 9, wherein the microwaves have a frequency of 2.45 GHz or 400 MHz.

11. The semiconductor processing system according to claim 1, wherein the plasma generation field is configured to activate the first process gas by an RF power applied from an RF power supply.

12. The semiconductor processing system according to claim 11, wherein the RF power has a frequency of 13.56 MHz.

13. The semiconductor processing system according to claim 1, wherein the second supply port comprises a plurality of supply port portions arrayed essentially over all the target objects in a vertical direction.

14. The semiconductor processing system according to claim 1, wherein each of the pre-process container and the second holder is formed of a metal material covered with a corrosion resistant coating.

15. The semiconductor processing system according to claim 1, further comprising a cooling mechanism configured to cool the pre-process container.

16. The semiconductor processing system according to claim 1, wherein the pre-process container comprises a load port formed at a bottom, through which the second holder with the target objects supported thereon is loaded and unloaded to and from pre-process container, and a lid configured to airtightly close the load port.

17. The semiconductor processing system according to claim 16, further comprising a shutter member configured to cover the load port when the lid is removed.

18. The semiconductor processing system according to claim 1, wherein the first process gas comprises a gas containing nitrogen atoms and hydrogen atoms, and the second process gas comprises a gas containing a halogen element.

19. The semiconductor processing system according to claim 18, wherein the semiconductor oxide film comprises a silicon oxide film.

20. The semiconductor processing system according to claim 1, wherein the vertical batch main-processing apparatus is configured to perform a film formation process as the semiconductor process.

21. The semiconductor processing system according to claim 1, wherein the transfer port unit comprises a load-lock box that has openings on two sides provided with gate valves and is configured to adjust pressure therein.

22. The semiconductor processing system according to claim 1, wherein the vertical batch pre-processing apparatus is connected to a ceiling portion of the casing.

23. The semiconductor processing system according to claim 1, wherein the vertical batch main-processing apparatus is connected to a ceiling portion of the casing.

24. The semiconductor processing system according to claim 1, wherein the heater of the vertical batch heat-processing apparatus comprises an inner heater disposed inside the heat-process container and extending along a heat-process field of the heat-process container for accommodating the second holder, and an outer heater disposed outside the heat-process container and extending along the heat-process field.

25. The semiconductor processing system according to claim 24, wherein the inner heater comprises a plurality of carbon wire heaters having a U-shape disposed to extend in a longitudinal direction of the heat-process container.

26. The semiconductor processing system according to claim 1, wherein the vertical batch heat-processing apparatus further comprises an inactive gas supply circuit configure to supply an inactive gas into the heat-process container.

27. The semiconductor processing system according to claim 1, wherein the heat-process container comprises a load port formed at a bottom, through which the target objects are loaded and unloaded to and from the heat-process container, and a lid configured to airtightly close the load port, and the vertical batch heat-processing apparatus further comprises a shutter member configured to cover the load port when the lid is removed.

* * * * *